United States Patent
Seino et al.

(10) Patent No.: US 10,410,870 B2
(45) Date of Patent: Sep. 10, 2019

(54) METHOD OF MANUFACTURING SEMICONDUCTOR DEVICE

(71) Applicant: HITACHI KOKUSAI ELECTRIC INC., Tokyo (JP)

(72) Inventors: Atsuro Seino, Toyama (JP); Arito Ogawa, Toyama (JP)

(73) Assignee: KOKUSA ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/925,221

(22) Filed: Mar. 19, 2018

(65) Prior Publication Data

US 2018/0211843 A1 Jul. 26, 2018

Related U.S. Application Data

(63) Continuation of application No. PCT/JP2015/077775, filed on Sep. 30, 2015.

(51) Int. Cl.
*H01L 21/20* (2006.01)
*H01L 21/285* (2006.01)
(Continued)

(52) U.S. Cl.
CPC ........ *H01L 21/28506* (2013.01); *C23C 16/14* (2013.01); *C23C 16/303* (2013.01); *C23C 16/45527* (2013.01); *H01L 21/28562* (2013.01); *H01L 21/32051* (2013.01); *H01L 21/76838* (2013.01)

(58) Field of Classification Search
None
See application file for complete search history.

(56) References Cited

U.S. PATENT DOCUMENTS 5,391,394 A * 2/1995 Hansen ............... C23C 16/04
257/E21.165
2003/0129308 A1 * 7/2003 Chen ............... C23C 16/18
427/255.28
(Continued)

FOREIGN PATENT DOCUMENTS

JP 2003-193233 A 7/2003
JP 2004-273764 A 9/2004
(Continued)

OTHER PUBLICATIONS

International Search Report for WO 2017/056242 A1, dated Oct. 27, 2015.

*Primary Examiner* — Calvin Y Choi
(74) *Attorney, Agent, or Firm* — Volpe and Koenig, P.C.

(57) ABSTRACT

A technique capable of controlling in-plane uniformity of a film formed on a substrate includes a step of forming a film on a substrate by performing a predetermined number of cycles in which a step of supplying a metal-containing gas to the substrate and a step of supplying a reducing gas containing an element that becomes a solid by itself to the substrate are performed in a time-division manner. The reducing gas has a property of changing a deposition rate of the film from an increasing rate to a decreasing rate in accordance with the exposure amount of the reducing gas with respect to the substrate. In the step of supplying the reducing gas, the exposure amount of the reducing gas with respect to the substrate is adjusted in accordance with the property of the reducing gas.

19 Claims, 8 Drawing Sheets

(51) Int. Cl.
   *H01L 21/3205* (2006.01)
   *C23C 16/14* (2006.01)
   *C23C 16/30* (2006.01)
   *C23C 16/455* (2006.01)
   *H01L 21/768* (2006.01)

(56) References Cited

U.S. PATENT DOCUMENTS

| | | |
|---|---|---|
| 2005/0032364 A1 | 2/2005 | Okubo et al. |
| 2005/0220998 A1* | 10/2005 | Chang .................. C23C 16/18 427/248.1 |
| 2007/0259110 A1 | 11/2007 | Mahajani et al. |
| 2010/0062157 A1* | 3/2010 | Hata .................... B82Y 30/00 427/249.1 |
| 2010/0330781 A1* | 12/2010 | Sasaki ................. C23C 16/325 438/478 |
| 2013/0023116 A1 | 1/2013 | Kumamoto et al. |
| 2013/0323935 A1 | 12/2013 | Suzuki et al. |
| 2015/0111378 A1 | 4/2015 | Ogawa et al. |

FOREIGN PATENT DOCUMENTS

| | | |
|---|---|---|
| JP | 2009-536267 A | 10/2009 |
| JP | 2014-007378 A | 1/2014 |
| JP | 2015-109419 A | 6/2015 |
| WO | 2011/27834 A1 | 3/2011 |

* cited by examiner

METHOD OF MANUFACTURING SEMICONDUCTOR DEVICE

CROSS-REFERENCE TO RELATED APPLICATION

This application is a Bypass Continuation Application of PCT International Application No. PCT/JP2015/077775, filed on Sep. 30, 2015, the entire contents of which are incorporated herein by reference.

TECHNICAL FIELD

The present disclosure relates to a method of manufacturing a semiconductor device.

RELATED ART

As one step of a process for manufacturing a semiconductor device (device), processing of forming a film on a substrate may be performed by supplying a raw material and a reducing agent to the substrate (for example, refer to Patent Literature 1). In such processing, control of in-plane uniformity of a substrate such as a film thickness may be required.

SUMMARY

An aspect of the present disclosure provides a technique including:

a step of forming a film on a substrate by performing a predetermined number of cycles in which a step of supplying a metal-containing gas to the substrate and a step of supplying a reducing gas containing an element that becomes a solid by itself to the substrate are performed in a time-division manner, in which the reducing gas has a property of changing a deposition rate of the film from an increasing rate to a decreasing rate in accordance with the exposure amount of the reducing gas with respect to the substrate, and in supplying the reducing gas, the exposure amount of the reducing gas with respect to the substrate is adjusted in accordance with the property of the reducing gas.

DESCRIPTION OF EMBODIMENTS

One Embodiment

Hereinafter, one embodiment of the present disclosure will described with reference to FIGS. 1 to 3.

(1) Configuration of Substrate Processing Apparatus

Figure 1:
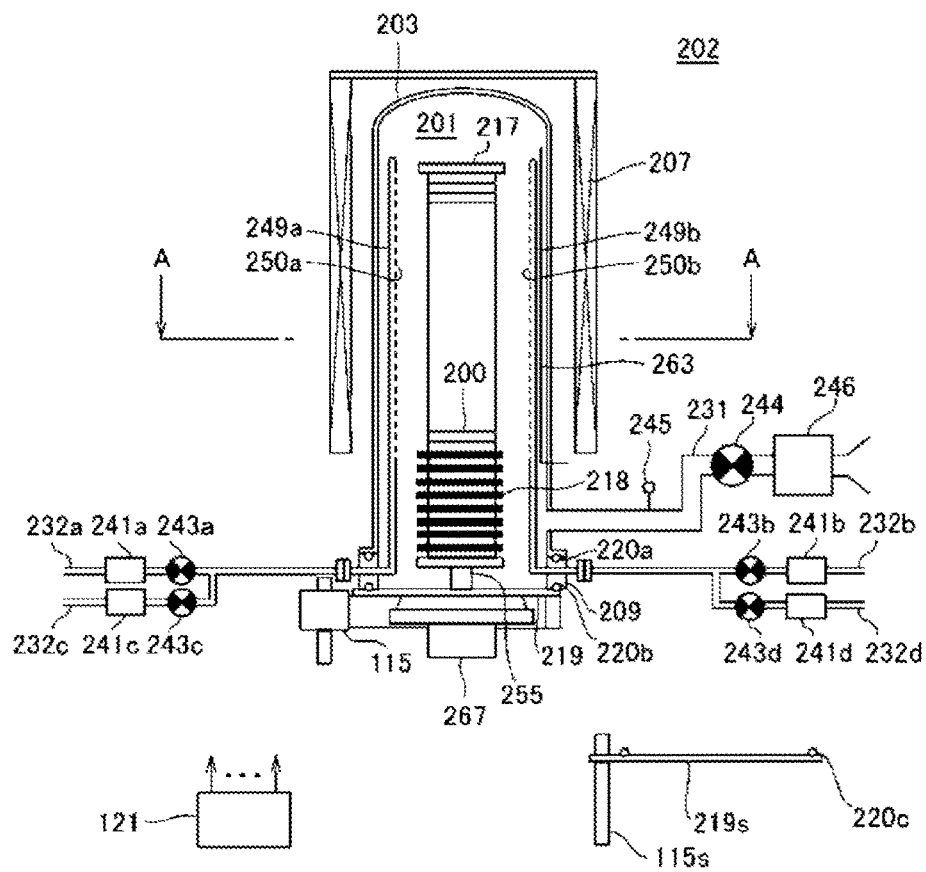
FIG. 1 is a schematic configuration diagram of a vertical process furnace of a substrate processing apparatus suitably used in an embodiment of the present disclosure, and illustrates a vertical cross-sectional view of a process furnace portion.
Figure 2:
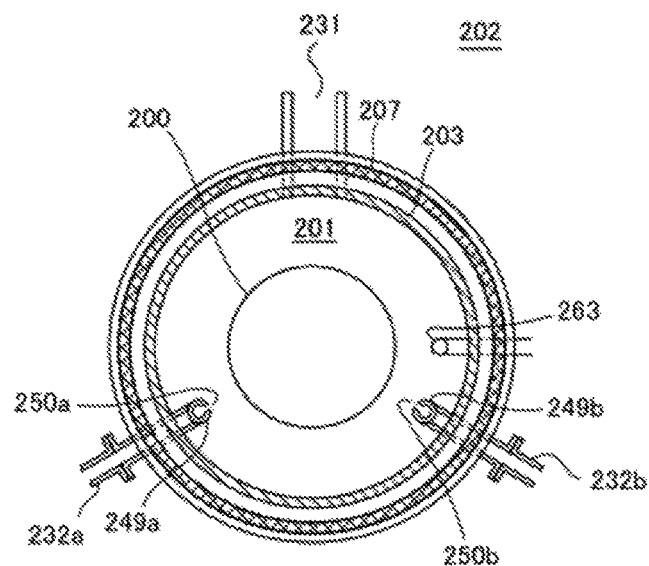
FIG. 2 is a schematic configuration diagram of a part of a vertical process furnace of a substrate processing apparatus suitably used in an embodiment of the present disclosure, and illustrates a cross-sectional view of a part of the process furnace cut along line A-A in FIG. 1.

As illustrated in FIG. 1, a process furnace 202 includes a heater 207 as a heating mechanism (temperature adjuster). The heater 207 has a cylindrical shape, is supported by a heater base (not illustrated) as a holding plate, and is thereby vertically disposed. The heater 207 also functions as an activation mechanism (excitation portion) for activating (exciting) a gas with heat as described later.

A reaction tube 203 is disposed concentrically with the heater 207 inside the heater 207. The reaction tube 203 is made of a heat-resistant material such as quartz ($SiO_2$) or silicon carbide (SiC), for example, and is formed in a cylindrical shape with an upper end closed and a lower end open. A manifold (inlet flange) 209 is disposed below the reaction tube 203 concentrically with the reaction tube 203. The manifold 209 is made of a metal such as stainless steel (SUS), for example, and is formed in a cylindrical shape with an upper end and a lower end opened. An upper end portion of the manifold 209 is engaged with a lower end portion of the reaction tube 203 and is configured to support the reaction tube 203. An O-ring 220a as a seal member is disposed between the manifold 209 and the reaction tube 203. The manifold 209 is supported by the heater base, and the reaction tube 203 is thereby vertically disposed. Mainly, the reaction tube 203 and the manifold 209 constitute a processing container (reaction container). A process chamber 201 is formed in a cylinder hollow portion of the processing container. The process chamber 201 is configured to be able to house wafers 200 as a plurality of substrates while the wafers 200 are arranged in a horizontal posture in multiple stages in a vertical direction by a boat 217 described later.

In the process chamber 201, nozzles 249a and 249b are disposed so as to pass through a side wall of the manifold 209. Gas supply pipes 232a and 232b are connected to the nozzles 249a and 249b, respectively. In this manner, the two nozzles 249a and 249b and the two gas supply pipes 232a and 232b are disposed in the processing container (manifold 209), and the processing container (manifold 209) can supply a plurality of kinds of gases into the process chamber 201.

In the gas supply pipes 232a and 232b, mass flow controllers (MFCs) 241a and 241b which are flow rate controllers (flow rate control portions) and valves 243a and 243b which are on-off valves are disposed in order from an upstream side, respectively. Gas supply pipes 232c and 232d for supplying an inert gas are connected to a downstream side of the valves 243a and 243b of the gas supply pipes 232a and 232b, respectively. MFCs 241c and 241d which are flow rate controllers (flow rate control portions) and valves 243c and 243d which are on-off valves are disposed in the gas supply pipes 232c and 232d in order from an upstream side, respectively.

The nozzles 249a and 249b are connected to tip portions of the gas supply pipes 232a and 232b, respectively. As illustrated in FIG. 2, the nozzles 249a and 249b are disposed in an annular space in plan view between an inner wall of the reaction tube 203 and each of the wafers 200 along an upper portion from a lower portion of the inner wall of the reaction tube 203 so as to rise upward in a stacking direction of the wafers 200. That is, the nozzles 249a and 249b are disposed along a wafer arrangement region where the wafers 200 are arranged in a region horizontally surrounding the wafer arrangement region on a lateral side of the wafer arrangement region. That is, the nozzles 249a and 249b are disposed vertically to a surface (flat surface) of each of the wafers 200 on a lateral side of an end portion (peripheral portion) of each of the wafers 200 loaded into the process chamber 201. The nozzles 249a and 249b are configured as L-shaped long nozzles. Horizontal portions thereof are disposed so as to pass through a side wall of the manifold 209, and vertical portions thereof are disposed so as to rise at least from one end side of the wafer arrangement region toward the other end side thereof. Gas supply holes 250a and 250b for supplying a gas are disposed on side surfaces of the nozzles 249a and 249b, respectively. Each of the gas supply holes 250a and 250b is open so as to face a center of the reaction tube 203, and can supply a gas toward the wafers 200. A plurality of the gas supply holes 250a and 250b is disposed from a lower portion to an upper portion of the reaction tube 203, has the same opening area, and is further disposed with the same opening pitch.

In this manner, in the present embodiment, a gas is transferred through an interior of a vertically elongated and annular space in plan view, defined by an inner wall of a side wall of the reaction tube 203 and end portions (peripheral portions) of the plurality of wafers 200 arranged in the reaction tube 203, that is, through the nozzles 249a and 249b disposed in a cylindrical space. Then, the gas is injected into the reaction tube 203 for the first time in the vicinity of the wafers 200 from the gas supply holes 250a and 250b opened to the nozzles 249a and 249b, respectively. Then, a main flow of the gas in the reaction tube 203 is in a direction parallel to surfaces of the wafers 200, that is, in a horizontal direction. With such a configuration, a gas can be uniformly supplied to each of the wafers 200, and uniformity of the film thickness of a film formed on each of the wafers 200 can be improved. A gas which has flowed on a surface of each of the wafers 200, that is, a residual gas after a reaction flows toward an exhaust port, that is, toward an exhaust pipe 231 described later. However, the direction of the flow of the residual gas is appropriately specified depending on the position of the exhaust port, and is not limited to a vertical direction.

From the gas supply pipe 232a, as a metal-containing raw material (hereinafter, also simply referred to as a raw material), a metal-containing halogen-based raw material (hereinafter, also simply referred to as a halogen-based raw material), for example, a halogen-based tungsten source gas containing tungsten (W) as a main element and a halogen element is supplied into the process chamber 201 through the MFC 241a, the valve 243a, and the nozzle 249a.

The halogen-based raw material refers to a raw material containing a metal element and a halogen group. The halogen group includes a chloro group, a fluoro group, a bromo group, an iodo group, and the like. That is, the halogen group includes a halogen element such as chlorine (Cl), fluorine (F), bromine (Br), or iodine (I). The halogen-based raw material can be said to be a kind of halide. Here, the term "raw material" may mean "a raw material in a gas state) (source gas)", "a raw material in a liquid state", "a raw material in a solid state", or all of these. In addition, here, the term "liquid source" may mean a raw material in a liquid state at normal temperature and normal pressure, a raw material which has been liquefied by, for example, making a raw material in a solid state at normal temperature and normal pressure into a powder and dissolving the powder in a solvent, or both of these.

As the halogen-based tungsten source gas, for example, a source gas containing W and F, that is, a fluorotungsten source gas can be used. The fluorotungsten source gas acts as a W source in film formation processing described later. As the fluorotungsten source gas, for example, tungsten hexafluoride, that is, a tungsten hexafluoride ($WF_6$) gas can be used.

From the gas supply pipe 232b, for example, a boron (B)-containing gas as a reducing agent (reducing gas) is supplied into the process chamber 201 through the MFC 241b, the valve 243b, and the nozzle 249b. As the B-containing gas, for example, a diborane ($B_2H_6$) gas can be used. The $B_2H_6$ gas can also be said to be a substance constituted by only two elements of B and H, and acts as a B source in film formation processing described later. The reducing agent only needs to be a gas containing an element which becomes a solid by itself. The element which becomes a solid by itself is, for example, boron (B) or silicon (Si). As the gas containing an element which becomes a solid by itself, for example, a silane ($SiH_4$) gas or a disilane ($Si_2H_6$) gas can be used in addition to the diborane ($B_2H_6$) gas.

From the gas supply pipes 232c and 232d, for example, a nitrogen ($N_2$) gas as an inert gas is supplied into the process chamber 201 through the MFCs 241c and 241d, the valves 243c and 243d, the gas supply pipes 232a and 232b, and the nozzles 249a and 249b, respectively.

Here, the source gas and the reducing gas mean a raw material and a reducing agent in a gas state, for example, a gas obtained by vaporizing or subliming a raw material and a reducing agent in a liquid state or a solid state at normal temperature and normal pressure, or dissolving the raw material and the reducing agent in a solvent and vaporizing the solution, and a raw material and a reducing agent in a gas state at normal temperature and normal pressure. Here, the term "raw material" may mean "a raw material in a gas state) (source gas)", "a raw material in a liquid state", "a raw material in a solid state", or all of these. In addition, here, the term "liquid source" may mean a raw material in a liquid state at normal temperature and normal pressure, a raw material which has been liquefied by, for example, making a raw material in a solid state at normal temperature and normal pressure into a powder and dissolving the powder in a solvent, or both of these. Here, the term "reducing agent" may mean "a liquid reducing agent in a liquid state", "a solid reducing agent in a solid state", "a reducing gas in a gas state", or a combination thereof. In a case of using a liquid source or the like in a liquid state at normal temperature and normal pressure or a solid raw material or the like in a solid state at normal temperature and normal pressure, a liquid source or the like and a solid raw material or the like are vaporized or sublimed with a system such as a vaporizer, a bubbler, or a sublimator, and are supplied as a source gas or a reducing gas.

In a case where the above-described raw material is supplied from the gas supply pipe 232a, mainly, the gas supply pipe 232a, the MFC 241a, and the valve 243a constitute a raw material supply system. The nozzle 249a may be included in the raw material supply system. The raw material supply system can also be referred to as a source gas supply system. In a case where the above-described metal-containing raw material is supplied as a raw material, the raw material supply system can also be referred to as a metal-containing raw material supply system or a metal-containing source gas supply system. Furthermore, in a case where a halogen-based raw material is supplied as a metal-containing raw material, the raw material supply system can also be referred to as a halogen-based raw material supply system or a halogen-based source gas supply system.

In a case where the above-described reducing agent is supplied from the gas supply pipe 232b, mainly, the gas supply pipe 232b, the MFC 241b, and the valve 243b constitute a reducing agent supply system. The nozzle 249b may be included in the reducing agent supply system. The reducing agent supply system can also be referred to as a reducing gas supply system. In a case where the above-described B-containing gas is used as a reducing agent, the reducing agent supply system can also be referred to as a B-containing gas supply system. In a case where a borane-based gas is supplied as a reducing agent, the reducing agent supply system can also be referred to as a borane-based gas supply system or a borane supply system.

In addition, mainly, the gas supply pipes 232c and 232d, the MFCs 241c and 241d, and the valves 243c and 243d constitute an inert gas supply system.

Mainly, the material supply system and the reducing agent supply system constitute a supply system. An inert gas supply system may be included in the supply system.

The exhaust pipe 231 for exhausting an atmosphere in the process chamber 201 is disposed in the reaction tube 203. A vacuum pump 246 as a vacuum-exhaust device is connected to the exhaust pipe 231 through a pressure sensor 245 as a pressure detector (pressure detecting portion) for detecting a pressure in the process chamber 201 and an auto pressure controller (APC) valve 244 as a pressure regulator (pressure regulating portion). By opening and closing a valve while the vacuum pump 246 is operated, the APC valve 244 can perform vacuum-exhaust and can stop vacuum-exhaust in the process chamber 201. Furthermore, by adjusting the degree of valve opening based on pressure information detected by the pressure sensor 245 while the vacuum pump 246 is operated, the APC valve 244 can regulate a pressure in the process chamber 201. Mainly, the exhaust pipe 231, the APC valve 244, and the pressure sensor 245 constitute an exhaust system. The vacuum pump 246 may be included in the exhaust system.

A seal cap 219 as a furnace port lid body capable of airtightly closing a lower end opening of the manifold 209 is disposed below the manifold 209. The seal cap 219 is configured so as to come into contact with a lower end of the manifold 209 from a lower side in a vertical direction. The seal cap 219 is made of a metal such as SUS, for example, and is formed in a disc shape. An O-ring 220b as a seal member in contact with a lower end of the manifold 209 is disposed on an upper surface of the seal cap 219. A rotation mechanism 267 for rotating a boat 217 described later is disposed in the seal cap 219 on the opposite side to the process chamber 201. A rotation shaft 255 of the rotation mechanism 267 passes through the seal cap 219 and is connected to the boat 217. The rotation mechanism 267 is configured to rotate the wafers 200 by rotating the boat 217. The seal cap 219 is configured to be raised and lowered in a vertical direction by a boat elevator 115 as a raising/lowering mechanism disposed vertically outside the reaction tube 203. The boat elevator 115 is configured such that the boat 217 can be loaded into and unloaded from the process chamber 201 by raising and lowering the seal cap 219. The boat elevator 115 is configured as a transfer device (transfer mechanism) for transferring the boat 217, that is, the wafers 200 into and out of the process chamber 201. A shutter 219s as a furnace port lid body capable of airtightly closing a lower end opening of the manifold 209 while the seal cap 219 is being lowered by the boat elevator 115 is disposed below the manifold 209. The shutter 219s is made of a metal such as SUS, for example, and is formed in a disc shape. An O-ring 220c as a seal member in contact with a lower end of the manifold 209 is disposed on an upper surface of the shutter 219s. A shutter opening/closing mechanism 115s controls an opening/closing operation of the shutter 219s (raising/lowering operation, rotation operation, or the like).

The boat 217 as a substrate support member is configured to support the plurality of wafers 200, for example, 25 to 200 wafers 200 while the wafers 200 are aligned in a horizontal posture in a vertical direction in multiple stages with centers thereof aligned, that is, so as to cause the wafers 200 to be arranged at intervals. The boat 217 is made of a heat-resistant material such as quartz or SiC, for example. Heat insulating plates 218 made of a heat resistant material such as quartz or SiC, for example, are supported in multiple stages at a lower portion of the boat 217. With this configuration, heat from the heater 207 is less likely to be transmitted to the seal cap 219 side. However, the present embodiment is not limited to such a form. For example, a heat insulating cylinder configured as a tubular member made of a heat-resistant material such as quartz or SiC may be disposed without disposing the heat insulating plates 218 at a lower portion of the boat 217.

A temperature sensor 263 as a temperature detector is disposed in the reaction tube 203. By adjusting the degree of energization to the heater 207 based on temperature information detected by the temperature sensor 263, a temperature in the process chamber 201 has a desired temperature distribution. Like the nozzles 249a and 249b, the temperature sensor 263 is configured in an L shape, and is disposed along an inner wall of the reaction tube 203.

Figure 3:
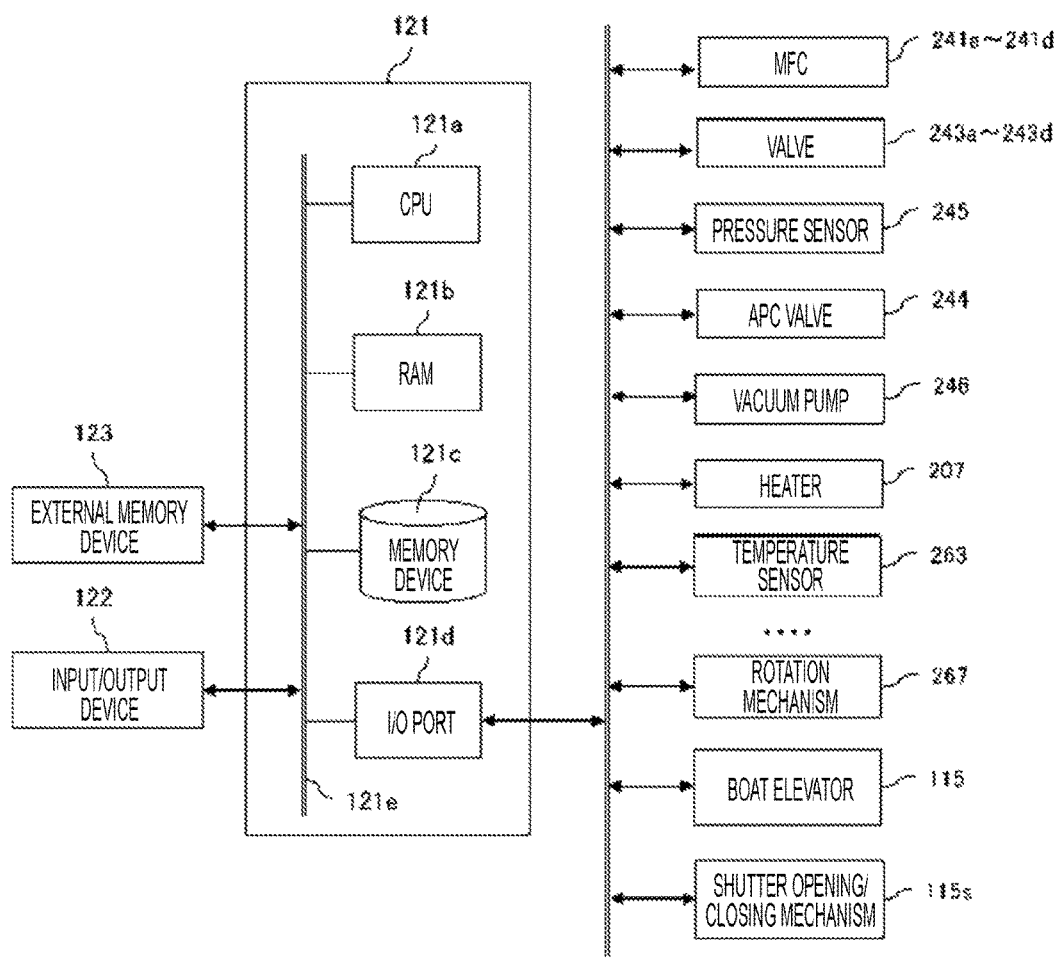
FIG. 3 is a schematic configuration diagram of a controller of a substrate processing apparatus suitably used in an embodiment of the present disclosure, and is a block diagram of a control system of the controller.

As illustrated in FIG. 3, a controller 121 which is a controller (control means) is configured as a computer including a central processing unit (CPU) 121a, a random access memory (RAM) 121b, a memory device 121c, and an I/O port 121d. The RAM 121b, the memory device 121c, and the I/O port 121d are configured to be able to exchange data with the CPU 121a through an internal bus 121e. An input/output device 122 configured, for example, as a touch panel is connected to the controller 121.

The memory device 121c includes, for example, a flash memory and a hard disk drive (HDD). In the memory device 121c, a control program for controlling an operation of a substrate processing apparatus, a process recipe in which procedures, conditions, and the like of film formation processing described later are written, and the like are readably stored. The process recipe is such a combination that a predetermined result can be obtained by causing the controller 121 to execute procedures in film formation processing described later, and functions as a program. Hereinafter, the process recipe, the control program, and the like are also collectively referred to simply as a program. In addition, the process recipe is also simply referred to as a recipe. Here, the term "program" may include only the process recipe itself, may include only the control program itself, or may include both of these. The RAM 121b is configured as a memory area (work area) in which a program, data, or the like read by the CPU 121a is temporarily stored.

The I/O port 121d is connected to the above-described MFCs 241a to 241d, valves 243a to 243d, pressure sensor 245, APC valve 244, vacuum pump 246, temperature sensor 263, heater 207, rotation mechanism 267, boat elevator 115, shutter opening/closing mechanism 115s, and the like.

The CPU 121a is configured to read a control program from the memory device 121c and execute the program, and to read a recipe from the memory device 121c in accordance with input of an operation command from the input/output device 122 or the like. The CPU 121a is configured to, according to the content of the recipe thus read, control operations of adjusting flow rates of various gases by the MFCs 241a to 241d, an operation of opening/closing the valves 243a to 243d, an operation of opening/closing the APC valve 244, a pressure adjusting operation by the APC valve 244 based on the pressure sensor 245, starting/stopping the vacuum pump 246, an operation of adjusting a temperature of the heater 207 based on the temperature sensor 263, operations of rotating the boat 217 and adjusting a rotational speed of the boat 217 by the rotation mechanism 267, an operation of raising/lowering the boat 217 by the boat elevator 115, an operation of opening/closing the shutter 219s by the shutter opening/closing mechanism 115s, and the like.

The controller 121 can be configured by installing the above-described program stored in an external memory device (for example, a magnetic tape, a magnetic disk such as a flexible disk or a hard disk, an optical disk such as CD or DVD, a magneto-optical disk such as MO, or a semiconductor memory such as a USB memory or a memory card) 123 in a computer. The memory device 121c or the external memory device 123 is configured as a computer-readable recording medium. Hereinafter, these are also collectively and simply referred to as a recording medium. Here, the term "recording medium" may include only the memory device 121c itself, may include only the external memory device 123 itself, or may include both of these. Note that provision of a program to a computer may be performed using a communication means such as the Internet or a dedicated line without using the external memory device 123.

(2) Film Formation Processing

A sequence example of forming a film on a substrate will be described with reference to FIG. 4 as one step of a process for manufacturing a semiconductor device (device) using the above-described substrate processing apparatus. In the following description, an operation of each part constituting the substrate processing apparatus is controlled by the controller 121.

Figure 4:
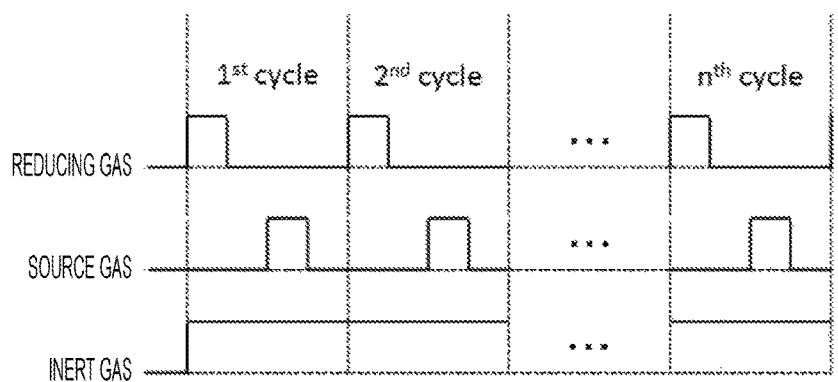
FIG. 4 is a diagram illustrating a film formation sequence of one embodiment of the present disclosure.

In the film formation sequence illustrated in FIG. 4, by performing a cycle including step 1 of supplying a $B_2H_6$ gas as a reducing agent and step 2 of supplying a $WF_6$ gas as a metal-containing raw material to the wafers 200 as substrates a predetermined number of times (once or more), a tungsten film (W film) as a film containing W is formed on each of the wafers 200.

Here, the film formation sequence illustrated in FIG. 4 is sometimes described as follows for convenience. A similar notation is also used in description of the following Modified Examples and other embodiments.

$$[B_2H_6 \rightarrow WF_6] \times n \Rightarrow W$$

Here, the term "wafer" may mean "a wafer itself" or "a stacked body (assembly) of a wafer and a predetermined layer, film, or the like formed on a surface of the wafer". That is, a wafer may mean a wafer including a predetermined layer, film, or the like formed on a surface of the wafer. Here, the term "surface of a wafer" may mean "a surface (exposed surface) of a wafer itself" or "a surface of a predetermined layer, film, or the like formed on the wafer, that is, an outermost surface of the wafer as a stacked body".

Therefore, here, the phrase "a predetermined gas is supplied to a wafer" may mean that "a predetermined gas is directly supplied to a surface (exposed surface) of a wafer itself", or may mean "a predetermined gas is supplied to a layer, a film, or the like formed on a wafer, that is, to an outermost surface of a wafer as a stacked body". In addition, here, the phrase "a predetermined layer (or film) is formed on a wafer" may mean that "a predetermined layer (or film) is directly formed on a surface (exposed surface) of a wafer itself", or may mean "a predetermined layer (or film) is formed on a layer, a film, or the like formed on a wafer, that is, on an outermost surface of a wafer as a stacked body".

Here, the term "substrate" is synonymous with the term "wafer".

(Substrate Preparation Step)

When the plurality of wafers 200 is loaded into the boat 217 (wafer charge), the shutter opening/closing mechanism 115s moves the shutter 219s and opens a lower end opening of the manifold 209 (shutter open). Thereafter, as illustrated in FIG. 1, the boat 217 supporting the plurality of wafers 200 is lifted up by the boat elevator 115 and loaded into the process chamber 201 (boat loading). In this state, the seal cap 219 seals a lower end of the manifold 209 through the O-ring 220b.

(Pressure/Temperature Adjustment Step)

The vacuum pump 246 performs vacuum exhaust (decompression exhaust) such that the interior of the process chamber 201, that is, a space where the wafers 200 exist, has a desired pressure (degree of vacuum). At this time, the pressure inside the process chamber 201 is measured by the pressure sensor 245, and the APC valve 244 is feedback-controlled based on the measured pressure information. The vacuum pump 246 maintains a state of being normally operated at least until film formation processing described later is completed. The wafers 200 in the process chamber 201 are heated by the heater 207 so as to have a desired film formation temperature. At this time, the degree of energization to the heater 207 is feedback-controlled based on temperature information detected by the temperature sensor 263 such that the interior of the process chamber 201 has a desired temperature distribution. Heating in the process chamber 201 by the heater 207 is continuously performed at least until film formation processing described later is completed. Rotation of the boat 217 and the wafers 200 by the rotation mechanism 267 is started. The rotation of the boat 217 and the wafers 200 by the rotation mechanism 267 is continuously performed at least until film formation processing described later is completed.

(Film Formation Step)

Thereafter, the following two steps, that is, steps 1 and 2 are sequentially performed.

[Step 1]

In this step, a $B_2H_6$ gas is supplied to the wafers 200 in the process chamber 201. Specifically, with the valves 243a and 243d closed, the valve 243b is opened and the $B_2H_6$ gas is caused to flow into the gas supply pipe 232b. The $B_2H_6$ gas may cause a polymerization reaction to proceed at room temperature to generate higher order borane. Generation of higher order borane in the raw material supply system causes malfunction of an MFC and a valve and generates particles. Therefore, before the $B_2H_6$ gas is supplied into the gas supply pipe 232b, the $B_2H_6$ gas is diluted with a gas that is inert to $B_2H_6$, such as an $N_2$ gas or an $H_2$ gas. For example, a $B_2H_6$ gas (5% $B_2H_6$ gas) diluted at a ratio of $B_2H_6$ gas:$N_2$ gas=5:95 is used. By diluting the $B_2H_6$ gas, generation of higher order borane in the raw material supply system can be suppressed. Hereinafter, the diluted $B_2H_6$ gas is simply referred to as a $B_2H_6$ gas. A flow rate of the $B_2H_6$ gas is adjusted by the MFC 241b. The $B_2H_6$ gas is supplied into the process chamber 201 through the gas supply pipe 232b and the nozzle 249b, and is exhausted from the exhaust pipe 231. At this time, the $B_2H_6$ gas is supplied to the wafers 200.

In order to prevent enter of the $B_2H_6$ gas into the nozzle 249a, the valve 243c is opened, and an $N_2$ gas is caused to flow into the gas supply pipe 232c. The $N_2$ gas is supplied into the process chamber 201 through the gas supply pipe 232c and the nozzle 249a, and is exhausted from the exhaust pipe 231.

At this time, the APC valve 244 is appropriately adjusted, and a pressure in the process chamber 201 is set to, for example, 30 to 5000 Pa, preferably 70 to 1300 Pa. In a case where the pressure in the process chamber 201 is lower than 30 Pa, there is a possibility that the supply amount of the $B_2H_6$ gas to the wafers 200 is insufficient, and a deposition rate does not reach a convergence region described later. In a case where the pressure in the process chamber 201 is higher than 5000 Pa, the supply amount of the $B_2H_6$ gas to the wafers 200 may be excessive, and the deposition rate may decrease. Incidentally, here, for example, 30 to 5000 Pa described as a range of numerical values means 30 Pa or more and 5000 Pa or less. That is, the range of numerical values includes 30 Pa and 5000 Pa. Not only the pressure but all the numerical values described here, such as a flow rate, time, or temperature, are similar.

A supply flow rate of the diluted $B_2H_6$ gas controlled by the MFC 241b is set to a flow rate within such a range that the supply flow rate of the $B_2H_6$ gas before dilution is, for example, 50 to 500 sccm, preferably 150 to 450 sccm. In a case where the supply flow rate of the $B_2H_6$ gas is smaller than 50 sccm, there is a possibility that the supply amount of the $B_2H_6$ gas to the wafers 200 is insufficient, and a deposition rate does not reach a convergence region described later. In a case where the supply flow rate of the $B_2H_6$ gas is larger than 450 sccm, the supply amount of the $B_2H_6$ gas to the wafers 200 may be excessive, and the deposition rate may decrease. The supply flow rate of the $N_2$ gas controlled by the MFC 241c is set to, for example, 0.2 to 12 slm, preferably 1 to 5 slm.

Time (gas supply time) for supplying the $B_2H_6$ gas to the wafers 200 is set to, for example, 10 to 50 seconds, preferably 20 to 40 seconds. In a case where the gas supply time is shorter than 10 seconds, there is a possibility that the supply amount of the $B_2H_6$ gas to the wafers 200 is insufficient, and a deposition rate does not reach a convergence region described later. In a case where the gas supply time is longer than 50 seconds, the supply amount of the $B_2H_6$ gas to the wafers 200 may be excessive, and the deposition rate may decrease.

The temperature of the heater 207 is set to such a temperature that makes the temperature of the wafers 200, for example, 60 to 230° C., preferably 130 to 200° C. In a case where the temperature of the wafers 200 is lower than 60° C., a sufficient deposition rate cannot be obtained. By setting the temperature of the wafers 200 to 60° C. or higher, an appropriate deposition rate can be obtained. By setting the temperature of the wafers 200 to 130° C. or higher, a more appropriate deposition rate can be obtained. In a case where the temperature of the wafers 200 is higher than 230° C., thermal decomposition of the $B_2H_6$ gas proceeds, and a film is not necessarily formed. By setting the temperature of the wafers 200 to 230° C. or lower, this problem can be solved. By setting the temperature of the wafers 200 to 200° C. or lower, a film can be formed more easily. Therefore, the temperature of the wafers 200 is favorably 60 to 230° C., and preferably 130° C. to 200° C.

By supplying the $B_2H_6$ gas, for example, a B-containing layer having a thickness of less than monolayer to several atomic layers is formed on each of the wafers 200. The B-containing layer may be a B layer or an adsorption layer of $B_2H_6$ (hereinafter, also referred to as an adsorption layer of a reducing agent molecule). The B layer includes not only a continuous layer constituted by B but also a discontinuous layer. That is, the B layer includes a B deposition layer having a thickness of less than monolayer to several atomic layers constituted by B. The B layer may contain H. The adsorption layer of a reducing agent molecule includes not only a continuous adsorption layer constituted by a $B_2H_6$ molecule but also a discontinuous adsorption layer. That is, the adsorption layer of a reducing agent molecule includes one molecular layer constituted by a $B_2H_6$ molecule or an adsorption layer having a thickness of less than one molecular layer. The $B_2H_6$ molecule constituting the adsorption layer of a reducing agent molecule also includes a molecule in which a bond between B and H is partially broken. That is, the adsorption layer of a reducing agent molecule may be a $B_2H_6$ physical adsorption layer or a $B_2H_6$ chemical adsorption layer, or may include both of these.

Here, the layer having a thickness of less than monolayer means an atomic layer formed discontinuously, and a layer having a thickness of monolayer means an atomic layer formed continuously. The layer having a thickness of less than one molecular layer means a molecular layer formed discontinuously, and a layer having a thickness of one molecular layer means a molecular layer formed continuously. The B-containing layer may include both the B layer containing H and an adsorption layer of a reducing agent molecule.

As illustrated in the following reaction formula, $B_2H_6$ adsorbed on each of the wafers 200 undergoes a reduction reaction with a $WF_6$ gas supplied in step 2, and a W layer is formed on each of the wafers 200. That is, H of $B_2H_6$ reacts with F of the $WF_6$ gas to form hydrogen fluoride (HF), causing reduction. In addition, B of $B_2H_6$ reacts with F of the $WF_6$ gas to form boron trifluoride ($BF_3$), and boron trifluoride is desorbed. As a result, $B_2H_6$ and W are replaced with each other, and a W layer is formed.

$$B_2H_6 + 2WF_6 \rightarrow 2W + 6HF + 2BF_3 \qquad \text{Reaction formula}$$

Thereafter, the valve 243b is closed, and supply of the $B_2H_6$ gas is stopped. At this time, with the APC valve 244 open, the interior of the process chamber 201 is vacuum-exhausted by the vacuum pump 246, and the $B_2H_6$ gas which remains in the process chamber 201, is unreacted, or has contributed to formation of the B-containing layer is discharged from the interior of the process chamber 201. In addition, the valve 243d is opened to cause the $N_2$ gas to flow into the gas supply pipe 232d. The $N_2$ gas is supplied into the process chamber 201 through the gas supply pipe 232d and the nozzle 249b. Supply of the $N_2$ gas into the process chamber 201 is maintained with the valve 243c open. The $N_2$ gas acts as a purge gas, and an effect of discharging the gas remaining in the process chamber 201 from the interior of the process chamber 201 can be thereby enhanced.

At this time, the gas remaining in the process chamber 201 does not have to be completely discharged, and the interior of the process chamber 201 does not have to be completely purged. If the amount of the gas remaining in the process chamber 201 is very small, there is no adverse effect in subsequent step 2. A flow rate of the $N_2$ gas supplied into the process chamber 201 needs not to be high. For example, by supplying the $N_2$ gas in an amount approximately equal to the volume of the reaction tube 203 (process chamber 201), purging can be performed to such an extent that there is no adverse effect in step 2. In this manner, by not perfectly purging the interior of the process chamber 201, purge time can be shortened, and throughput can be improved. It is also possible to minimize consumption of the $N_2$ gas.

[Step 2]

After step 1 is completed, the $WF_6$ gas is supplied to the wafers 200 in the process chamber 201.

In this step, with the valve 243b closed, the valves 243a, 243c, and 243d are opened. A flow rate of the $WF_6$ gas is adjusted by the MFC 241a. The $WF_6$ gas is supplied into the Process chamber 201 through the nozzle 249a, and is exhausted from the exhaust pipe 231. At this time, the $WF_6$ gas is supplied to the wafers 200.

The supply flow rate of the $WF_6$ gas controlled by the MFC 241a is set to, for example, 0.1 to 3.0 slm, preferably 0.3 to 1.2 slm. The pressure in the process chamber 201 is set to, for example, 30 to 1500 Pa, preferably 50 to 900 Pa. Time for supplying the $WF_6$ gas to the wafers 200 is set to, for example, 3 to 50 seconds, preferably 10 to 40 seconds. The other processing conditions are similar to those in step 1, for example.

By supplying the $WF_6$ gas to the wafers 200 under the above-described conditions, a W layer having a thickness of, for example, less than monolayer to several atomic layers is formed on each of the wafers 200. That is, F of the $WF_6$ gas reacts with H of $B_2H_6$ adsorbed on the wafers 200 to form hydrogen fluoride (HF), and is reduced. In addition, B of $B_2H_6$ reacts with F of the $WF_6$ gas to form $BF_3$, and $BF_3$ is desorbed. As a result, $B_2H_6$ and W are replaced with each other, and a W layer is formed.

The W layer includes not only a continuous layer constituted by W but also a discontinuous layer. That is, the W layer includes a W deposition layer having a thickness of less than monolayer to several atomic layers constituted by W.

After the W layer is formed, the valve 243a is closed and supply of the $WF_6$ gas is stopped. Then, by a similar processing procedure to step 1, the $WF_6$ gas which remains in the process chamber 201, is unreacted, or has contributed to formation of the W layer, or reaction by-products are discharged from the interior of the process chamber 201. At this time, similarly to step 1, it is not necessary to completely discharge the gas or the like remaining in the process chamber 201.

As a raw material, a halogen-based titanium source gas such as a tungsten hexachloride ($WCl_6$) gas or a tungsten hexabromide ($WBr_6$) gas can be used in addition to the $WF_6$ gas. An organic tungsten source gas such as hexacarbonyl tungsten ($W(CO)_6$) gas can also be used.

As the raw material, in place of W, a halogen-based metal source gas containing a metal element such as zirconium (Zr), hafnium (Hf), tantalum (Ta), niobium (Nb), molybdenum (No), titanium (T), yttrium (Y), strontium (Sr), or aluminum (Al) as a main element can also be used.

For example, as a raw material, a chloro-based metal source gas such as a zirconium tetrachloride ($ZrCl_4$) gas, a hafnium tetrachloride ($HfCl_4$) gas, a tantalum pentachloride ($TaCl_5$) gas, a niobium pentachloride ($NbCl_5$) gas, a molybdenum pentachloride ($MoCl_5$) gas, a titanium tetrachloride ($TiCl_4$) gas, an yttrium trichloride ($YCl_3$) gas, a strontium dichloride ($SrCl_2$) gas, or an aluminum trichloride ($AlCl_3$) gas can also be used.

In addition, for example, as a raw material, a fluoro-based metal source gas such as a zirconium tetrafluoride ($ZrF_4$) gas, a hafnium tetrafluoride ($HfF_4$) gas, a tantalum pentafluoride ($TaF_5$) gas, a niobium pentafluoride ($NbF_5$) gas, a molybdenum hexafluoride ($MoF_6$) gas, a titanium tetrafluoride ($TiF_4$) gas, an yttrium trifluoride ($YF_3$) gas, a strontium difluoride ($SrF_2$) gas, or an aluminum trifluoride ($AlF_3$) gas can also be used.

In addition, for example, as a raw material, a bromo-based metal source gas such as a zirconium tetrabromide ($ZrBr_4$) gas, a hafnium tetrabromide ($HfBr_4$) gas, a tantalum pentabromide ($TaBr_5$) gas, a niobium pentabromide ($NbBr_5$) gas, a titanium tetrabromide ($TiBr_4$) gas, an yttrium tribromide ($YBr_3$) gas, a strontium dibromide ($SrBr_2$) gas, or an aluminum tribromide ($AlBr_3$) gas can also be used.

In addition, for example, as a raw material, an iodo-based metal source gas such as a zirconium tetraiodide ($ZrI_4$) gas, a hafnium tetraiodide ($HfI_4$) gas, a tantalum pentaiodide ($TaI_5$) gas, a niobium pentaiodide ($NbI_5$) gas, an yttrium triiodide ($YI_3$) gas, a strontium diiodide ($SrI_2$) gas, or an aluminum triiodide ($AlI_3$) gas can also be used.

In addition, as a raw material, a halogen-based half metal source gas containing a half metal element such as silicon (Si), germanium (Ge), boron (B), antimony (Sb), or tellurium (Te) as a main element can also be used. For example, as a raw material, a halogen-based silicon source gas such as a silicon tetrachloride ($SiCl_4$) gas, a silicon tetrachloride ($SiF_4$) gas, a silicon tetrabromide ($SiBr_4$) gas, or a silicon tetraiodide ($SiI_4$) gas can also be used. In addition, for example, as a raw material, a halogen-based boron source gas such as a boron trichloride ($BCl_3$) gas, a boron trichloride ($BF_3$) gas, a boron tribromide ($BBr_3$) gas, or a boron triiodide ($BI_3$) gas can also be used.

As the inert gas, in addition to the $N_2$ gas, a rare gas such as an Ar gas, a He gas, a Ne gas, or a Xe gas can be used.

(Performance of a Predetermined Number of Times)

By performing a predetermined number of times (n times) of cycles of non-simultaneously, that is, non-synchronously, Performing the above-described steps 1 and 2, a W film having a predetermined composition and a predetermined thickness can be formed on each of the wafers 200. The above-described cycle is preferably performed a plurality of times. That is, preferably, the thickness of a B-containing layer formed in one cycle is smaller than a desired film thickness, and a plurality of times of the above-described cycles is performed repeatedly until the film thickness of a W film formed by stacking a W layer formed by a reaction between $B_2H_6$ and a $WF_6$ gas in the B-containing layer becomes a desired film thickness.

(After Purge Step/Atmospheric Pressure Return Step)

When the film formation step is completed, the $N_2$ gas is supplied into the process chamber 201 from each of the gas supply pipes 232c and 232d, and exhausted from the exhaust pipe 231. The $N_2$ gas acts as a purge gas. As a result, the interior of the process chamber 201 is purged, and the gas remaining in the process chamber 201 and reaction by-products are removed from the interior of the process chamber 201 (after purge). Thereafter, the atmosphere in the process chamber 201 is replaced with an inert gas (inert gas replacement), and the pressure in the process chamber 201 is returned to a normal pressure (return to atmospheric pressure).

(Unload Step)

Thereafter, the seal cap 219 is lowered by the boat elevator 115, a lower end of the manifold 209 is opened, and the processed wafers 200 are unloaded from the lower end of the manifold 209 to an outside of the reaction tube 203 while being supported by the boat 217 (boat unloading). After boat unloading, the shutter 219s is moved, and the lower end opening of the manifold 209 is sealed by the shutter 219s through the O-ring 220c (shutter close). The processed wafers 200 are unloaded to an outside of the reaction tube 203 and then taken out from the boat 217 (wafer discharge).

According to intensive studies of the inventors, it has been found that the above-described film formation sequence has such a film formation property that a deposition rate r of a W film varies depending on an exposure amount d of the $B_2H_6$ gas to the wafers 200. Here, the exposure amount d of the gas to the wafers 200 is derived from the following formula (1).

$$d = P \times T \qquad \text{formula (1)}$$

P [Pa] represents a partial pressure of the gas, and T [min] represents supply time of the gas.

The partial pressure of the gas is derived from the following formula (2).

$$P = P_c \times L/L_c \qquad \text{formula (2)}$$

$P_c$ [Pa] represents a total pressure in a furnace, L [l] represents a flow rate of the gas, and $L_c$ [l] represents a total flow rate in the furnace.

Figure 5:
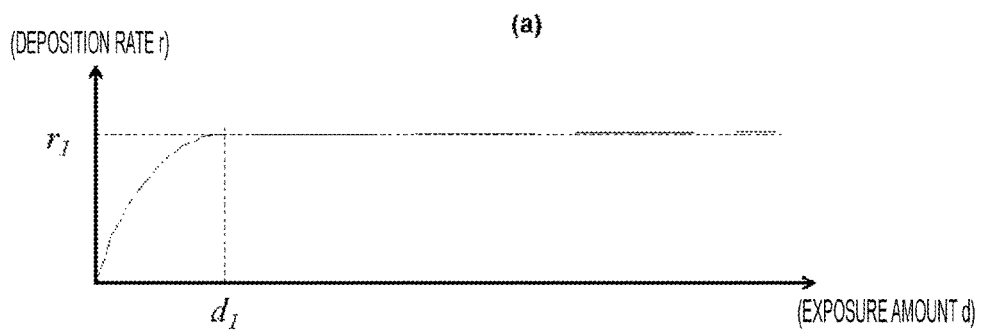
FIG. 5(a) is a graph for explaining a relationship between an exposure amount and a deposition rate in a general film formation sequence.
FIG. 5(b) is a graph for explaining a relationship between a deposition rate and an exposure amount in a film formation sequence of one embodiment of the present disclosure.
Figure 5:
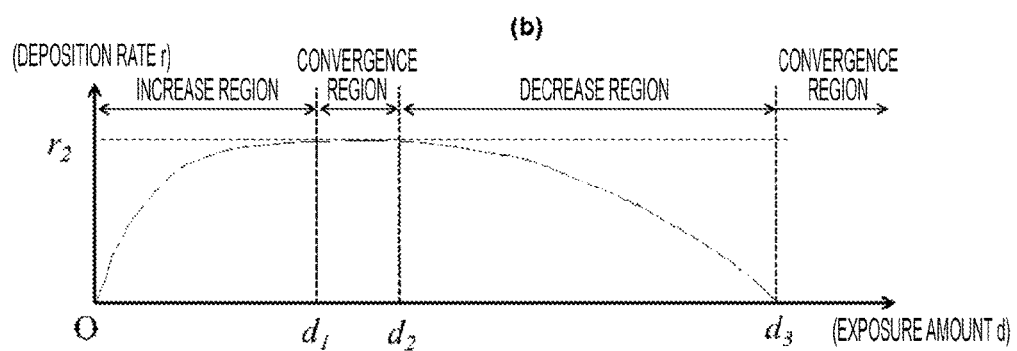

In general, in a case where a source gas and a reducing gas are alternately supplied to the wafers 200, as illustrated in FIG. 5(a), the deposition rate r with respect to the exposure amount d of the reducing gas increases within a range of $0<d<d_1$, and becomes almost constant within a range of $d_1 \leq d$. In other words, the deposition rate r converges to $r_1$. Meanwhile, in a case of the film formation sequence of the present embodiment, as illustrated in FIG. 5(b), it has been found that the deposition rate r with respect to the exposure amount d of the reducing gas increases within a range of $0<d<d_1$, converges in a range of $d_1 \leq d<d_2$, and decreases in a range of $d_2 \leq d<d_3$. Furthermore, it has been found that a W film is hardly formed in a range of $d_3 \leq d$. That is, it has been found that the $B_2H_6$ gas has such a film formation property as described below. As the exposure amount d of the $B_2H_6$ gas With respect to the wafers 200 is increased, the deposition rate r of a W film changes from increase to convergence. When the exposure amount d is further increased, the deposition rate r is changed from convergence to decrease. Hereinafter, a range where the exposure amount d is in a range of $0<d<d_1$ is referred to as an increase region, a range where the exposure amount d is in a range of $d_1 \leq d<d_2$ is referred to as a convergence region, a range where the exposure amount d is in a range of $d_2 \leq d<d_3$ is referred to as a decrease region, and a range where the exposure amount d is in a range of d is referred to as a suppression region.

As a factor that the deposition rate r decreases in the range of $d_2 \leq d$, it is considered that an adsorption site (reaction site or bond) of $B_2H_6$ with respect to the $WF_6$ gas decreases by excessive exposure of the $B_2H_6$ gas to the wafers 200. That is, when the $B_2H_6$ gas is excessively exposed to each of the wafers 200, it is considered that $B_2H_6$ adsorbed on each of the wafers 200 is desorbed or $B_2H_6$ molecules adsorbed in multiple layers on each of the wafers 200 react with each other. As a result, it is considered that a reaction between $B_2H_6$ adsorbed on each of the wafers 200 and the $WF_6$ gas does not occur and a W film is not formed. The reaction between $B_2H_6$ molecules adsorbed on each of the wafers 200 may occur between $B_2H_6$ molecules adjacent to each other vertically and horizontally. That is, in a case where the $B_2H_6$ gas is further exposed to each of the wafers 200 from a state in which $B_2H_6$ is adsorbed on each of the wafers 200 with a thickness of one molecular layer (saturated adsorption state), the adsorption site (bond) with respect to $WF_6$ starts to decrease in a partial region where $B_2H_6$ is adsorbed on each of the wafers 200. In a case where exposure of the $B_2H_6$ gas to each of the wafers 200 is further continued, it is considered that the adsorption site with respect to the $WF_6$ gas disappears in almost the entire region on each of the wafers 200.

From the above, it can be said that $d_1$ is the exposure amount when $B_2H_6$ is adsorbed on each of the wafers 200 with a thickness of one molecular layer. That is, it can be said that $d_1$ is the exposure amount when a reaction with the $WF_6$ gas occurs on the entire surface of each of the wafers 200. In addition, it can be said that $d_2$ is the exposure amount when $B_2H_6$ is adsorbed in multiple layers on a partial region on each of the wafers 200. In other words, it can be said that $d_2$ is the exposure amount when a reaction with the $WF_C$ gas does not occur on a partial region on each of the wafers 200. In addition, it can be said that d is the exposure amount when $B_2H_6$ is adsorbed in multiple layers in almost the entire region on each of the wafers 200. That is, it can be said that $d_3$ is the exposure amount when a reaction with the $WF_6$ gas does not occur in almost the entire region on each of the wafers 200.

From the above-described consideration, the inventors have found that by adjusting the supply amount of the $B_2H_6$ gas and adjusting the exposure amount d of the $B_2H_6$ gas with respect to the wafers 200, the deposition rate r of a W film can be controlled and a film thickness distribution on each of the wafers 200 can be controlled. In a case where the exposure amount d is different among positions on each of the wafers 200, the deposition rate r is different among positions. Therefore, uniformity of a film thickness may be deteriorated. In such a case, by supplying the $B_2H_6$ gas to the wafers 200 with an optimum supply amount, the exposure amount d of the $B_2H_6$ gas at each position can be controlled. Therefore, the film thickness distribution on each of the wafers 200 can be controlled.

Figure 6:
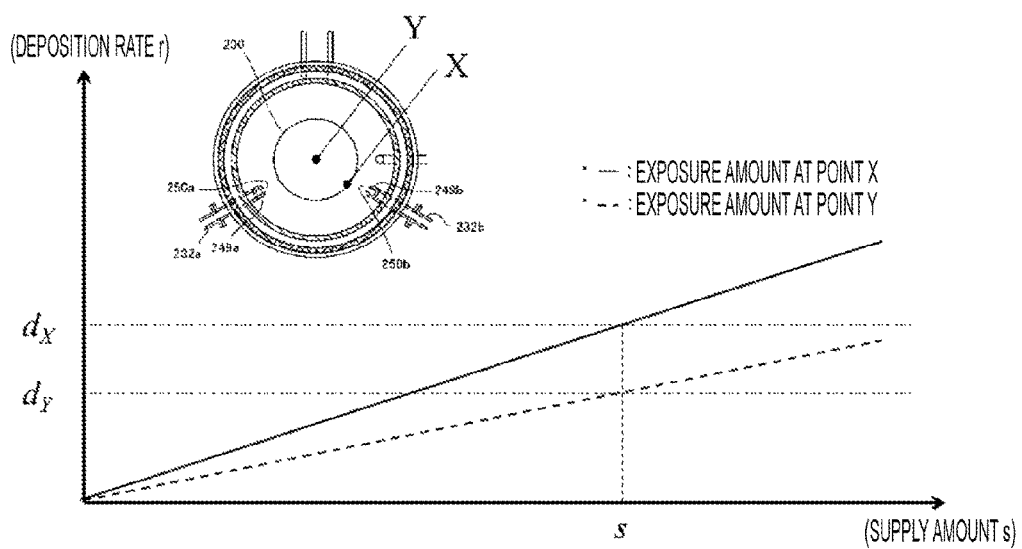
FIG. 6 is a graph for explaining a relationship between a supply amount and an exposure amount at a wafer center and an outer periphery.

For example, in a case of the above-described substrate processing apparatus, the $B_2H_6$ gas is easily supplied and the $B_2H_6$ gas partial pressure is high at an outer peripheral position of each of the wafers 200 indicated by a point X in FIG. 6. Therefore, an exposure amount $d_x$ of the $B_2H_6$ gas at the point X is large. Meanwhile, the $B_2H_6$ gas is hardly supplied and the $B_2H_6$ gas partial pressure is low at a center position of each of the wafers 200 indicated by a point Y. Therefore, an exposure amount $d_y$ of the $B_2H_6$ gas at the point Y is small. Therefore, in a case where the $B_2H_6$ gas is supplied to the wafers 200 with a supply amount s, the exposure amount of the $B_2H_6$ gas satisfies $d_y<d_x$. That is, the exposure amount of the $B_2H_6$ gas to the wafers 200 decreases from an outer periphery of each of the wafers 200 toward the center. As described above, the exposure amount of the $B_2H_6$ gas is different among positions in a plane of each of the wafers 200. Therefore, it is necessary to adjust the supply amount of the $B_2H_6$ gas so as to obtain an optimum exposure amount of the $B_2H_6$ gas in the entire plane of each of the wafers 200. Hereinafter, three supply examples will be described.

SUPPLY EXAMPLE 1

Figure 7:
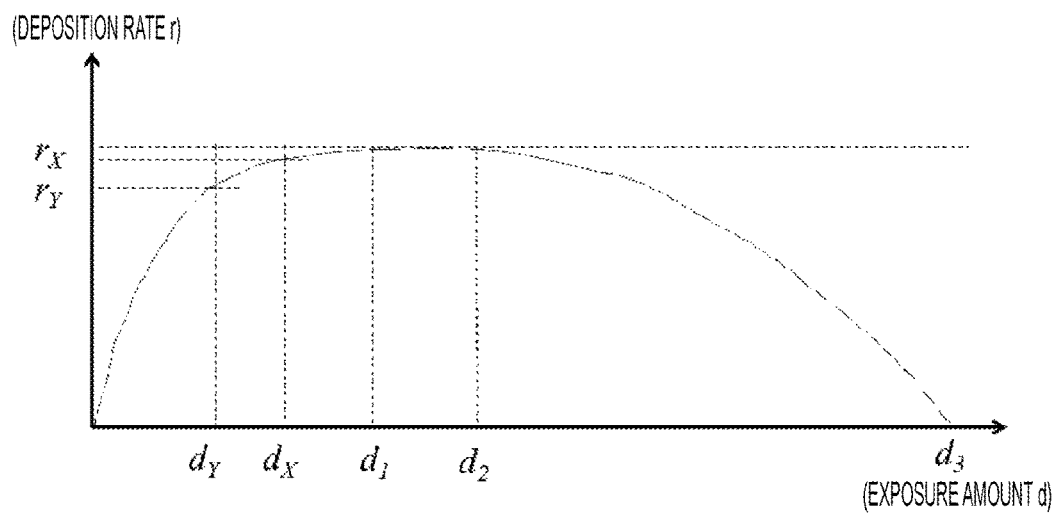
FIG. 7 is a graph for explaining a relationship between an exposure amount and a deposition rate in a case where the supply amount of a $B_2H_6$ gas is small.

As illustrated in FIG. 7, in a case where the supply amount of the $B_2H_6$ gas is small, that is, in a case where the exposure amount $d_y$ of the $B_2H_6$ gas is within an increase region, the exposure amounts $d_x$ and $d_y$ of the $B_2H_6$ gas satisfy $d_y<d_x$, $0<d_x \leq d_2$, and $0 \leq d_y<d_1$. Therefore, a deposition rate $r_x$ at the point X and a deposition rate $r_y$ at the point Y satisfy $r_x>r_y$. By setting such a condition that the exposure amount of the $B_2H_6$ gas satisfies the above condition of $d_x$ and $d_y$ and the exposure amount of the $WF_6$ gas satisfies $d>d_1$ (saturated adsorption condition), a film thickness distribution of a W film can have a recess shape (mortar shape). Here, even if the exposure amount $d_x$ of the $B_2H_6$ gas is within a convergence region, if the exposure amount $d_y$ of the $B_2H_6$ gas is within an increase region, the film thickness distribution of a W film can have a recess shape.

SUPPLY EXAMPLE 2

Figure 8:
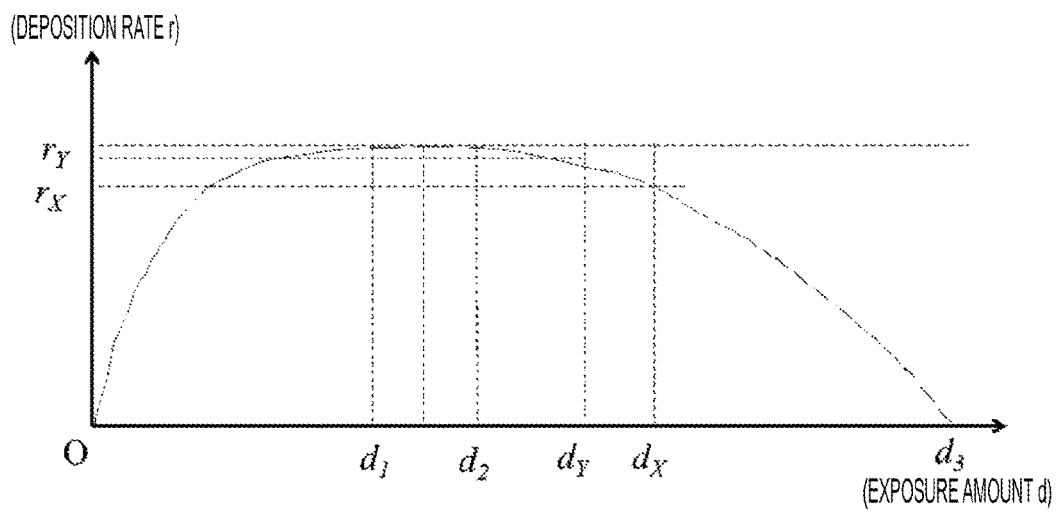
FIG. 8 is a graph for explaining a relationship between an exposure amount and a deposition rate in a case where the supply amount of a $B_2H_6$ gas is appropriate.

As illustrated in FIG. 8, in a case where the supply amount of the $B_2H_6$ gas is large, that is, in a case where the exposure amount $d_x$ of the $B_2H_6$ gas is within a decrease region, the exposure amounts $d_x$ and $d_y$ of the $B_2H_6$ gas satisfy $d_y<d_x$, $d_x>d_2$, and $d_y \geq d_1$. Therefore, the deposition rates $r_x$ and $r_y$ satisfy $r_x<r_y$. By setting such a condition that the exposure amount of the $B_2H_6$ gas satisfies the above condition of $d_x$ and $d_y$ and the exposure amount of the $WF_6$ gas satisfies $d>d_1$ (saturated adsorption condition), a film thickness distribution of a W film can have a protrusion shape (bowl shape). Here, even if the exposure amount $d_y$ of the $B_2H_6$ gas is within a convergence region, if the exposure amount $d_x$ of the $B_2H_6$ gas is within a decrease region, the film thickness distribution of a W film can have a protrusion shape.

SUPPLY EXAMPLE 3

Figure 9:
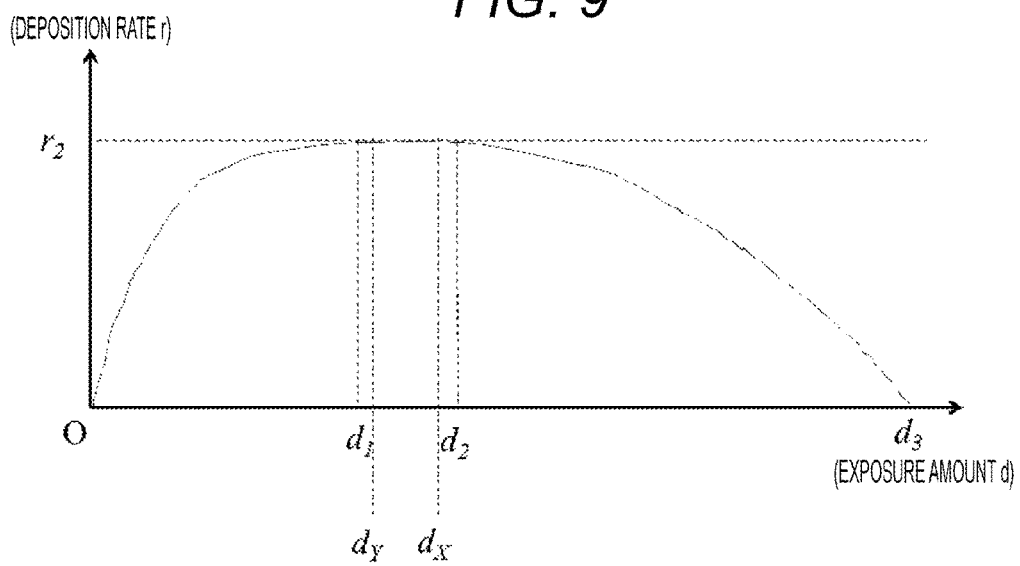
FIG. 9 is a graph for explaining a relationship between an exposure amount and a deposition rate in a case where the supply amount of a $B_2H_6$ gas is large.

As illustrated in FIG. 9, in a case where the supply amount of the $B_2H_6$ gas is appropriate, that is, in a case where the exposure amounts $d_x$ and $d_y$ of the $B_2H_6$ gas are within a convergence region, the exposure amounts $d_x$ and $d_y$ of the $B_2H_6$ gas satisfy $d_1<d_y<d_x<d_2$. Therefore, the deposition rates $r_x$ and $r_y$ have a relationship of $r_x \approx r_y \approx r_2$. That is, the deposition rates $r_x$ and $r_y$ are almost the same as each other. By setting such a condition that the exposure amount of the $B_2H_6$ gas satisfies the above condition of $d_x$ and $d_y$ and the exposure amount of the $WF_6$ gas satisfies $d>d_1$ (saturated adsorption condition), a film thickness distribution of a W film can have a horizontal shape (flat shape).

As described above, by adjusting the supply amount of the $B_2H_6$ gas, the exposure amount of the $B_2H_6$ gas can be adjusted, and a W film in which an in-plane film thickness distribution can arbitrarily controlled can be formed. The supply amount of the $B_2H_6$ gas is determined by a supply flow rate and supply time. Therefore, the supply amount in the present embodiment may be interpreted as a supply flow rate and supply time. Regarding a relationship between the supply amount and the exposure amount, the pressure in the process chamber 201 (partial pressure of $B_2H_6$ gas) at the time of supplying the $B_2H_6$ gas is also related. As is apparent from formula (1), for example, as the pressure of the process chamber 201 (partial pressure of $B_2H_6$ gas) at the time of supplying the $B_2H_6$ gas increases, the exposure amount of the $B_2H_6$ gas to the wafers 200 also increases. Therefore, also by adjusting the pressure (partial pressure of $B_2H_6$ gas) in the process chamber 201 at the time of supplying the $B_2H_6$ gas, the exposure amount of the $B_2H_6$ gas to the wafers 200 can be controlled. In addition, adsorption of the $B_2H_6$ gas into the planes of the wafers 200 has temperature dependency. Depending on a processing temperature, even with the same exposure amount, excessive supply or insufficient supply may occur with respect to the wafers 200. Therefore, the exposure amount of the $B_2H_6$ gas is preferably adjusted appropriately depending on a processing temperature.

Figure 10:
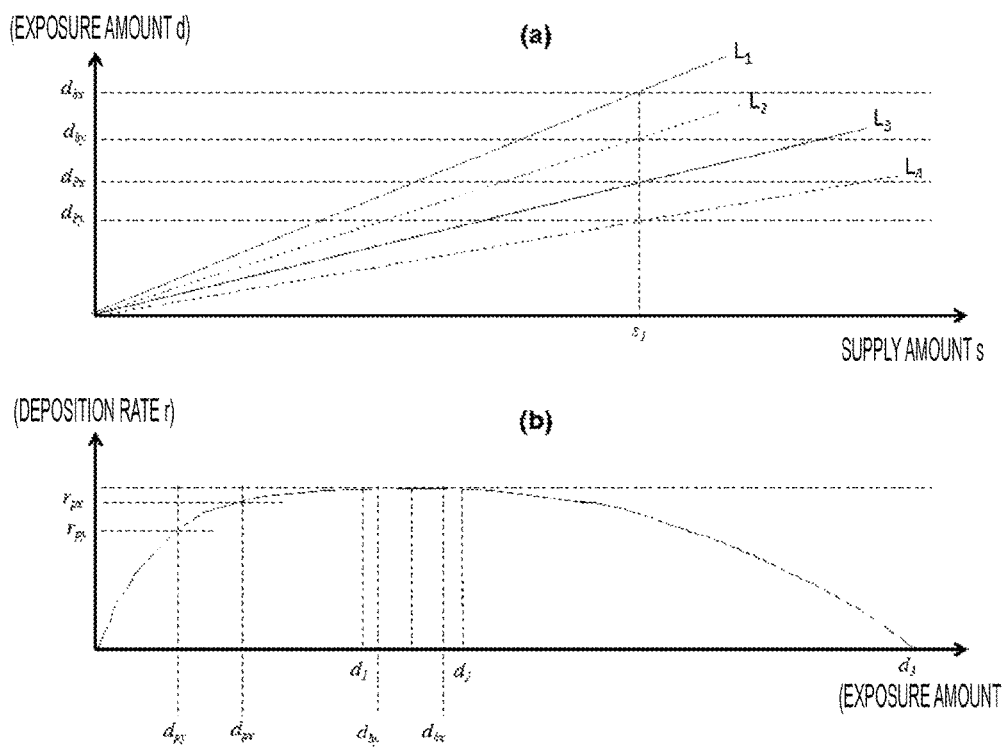
FIG. 10(a) is a graph for explaining a relationship between a supply amount and an exposure amount in a wafer on which a pattern is formed and a wafer on which no pattern is formed.
FIG. 10(b) is a graph for explaining a relationship between an exposure amount and a deposition rate in a wafer on which the pattern is formed and a wafer on which no pattern is formed.

In the above description, a case where a film is formed on a surface of any one of the wafers 200 on which a recess or a protrusion (pattern) such as a hole or a line space is not formed on the wafers 200 has been described. Here, a case where a film is formed on any one of the wafers 200 on which a pattern is formed will be described. In general, the surface area of any one of the wafers 200 on which a pattern is formed is larger than the surface area of any one of the wafers 200 on which no pattern is formed. Therefore, as illustrated in FIG. 10(a), an exposure amount $d_{px}$ (line $L_3$ in FIG. 10(a)) of the $B_2H_6$ gas at the point X of any one of the wafers 200 on which a pattern is formed is smaller than an exposure amount $d_{bx}$ (line $L_1$ in FIG. 10(a)) of the $B_2H_6$ gas at the point X of any one of the wafers 200 on which no pattern is formed in terms of the exposure amount of the $B_2H_6$ gas with respect to a supply amount $s_1$ ($d_{px}<d_{bx}$). Similarly, an exposure amount $d_{py}$ (line $L_4$ in FIG. 10(a)) at the point Y of any one of the wafers 200 on which a pattern is formed is smaller than an exposure amount $d_{by}$ (line $L_2$ in FIG. 10(a)) at the point Y of any one of the wafers 200 on which no pattern is formed in terms of the exposure amount of the $B_2H_6$ gas with respect to the supply amount $s_1$ ($d_{py}<d_{by}$). Therefore, in a case of forming a W film, as illustrated in FIG. 10(b), even with the exposure amounts $d_{bx}$ and $d_{by}$ of the $B_2H_6$ gas with which a horizontal (flat) film thickness distribution is obtained on any one of the wafers 200 on which no pattern is formed, the exposure amounts $d_{px}$ and $d_{py}$ of the $B_2H_6$ gas are insufficient on any one of the wafers 200 on which a pattern is formed, and a flat film thickness distribution cannot be obtained. That is, even with the supply amount of the $B_2H_6$ gas in which the exposure amounts $d_{bx}$ and $d_{by}$ of the $B_2H_6$ gas are within a convergence region, the exposure amounts $d_{px}$ and $d_{py}$ of the $B_2H_6$ gas fall within an increase region. In other words, it may be impossible to obtain the exposure amounts $d_{px}$ and $d_{py}$ of the $B_2H_6$ gas with which the deposition rates $r_{px}$ and $r_{py}$ on any one of the wafers 200 on which a pattern is formed reach a convergence region. For example, if the deposition rates and $r_{py}$ satisfy $r_{px}>r_{py}$, a film thickness distribution of a film formed on any one of the wafers 200 on which no pattern is formed may have a recess shape (mortar shape).

Furthermore, the exposure amount of the $B_2H_6$ gas per unit area is different between an upper portion in a recess and a lower portion lower than the upper portion in the recess. Therefore, the partial pressure of the $B_2H_6$ gas in the lower portion in the recess is lower than that in the upper portion in the recess. The film thickness of a W film in the lower portion in the recess is smaller than that in the upper portion in the recess. As a result, film thickness uniformity of a W film formed in the upper portion and the lower portion in the recess is deteriorated. Therefore, in a case where a film is formed in the recess, the supply amount of the $B_2H_6$ gas is preferably optimized according to the surface area of each of the wafers 200. For example, the $B_2H_6$ gas is preferably supplied to the wafers 200 with such a supply amount that the exposure amount of the $B_2H_6$ gas at each position in a plane of each of the wafers 200 is the exposure amount of the $B_2H_6$ gas within a convergence region. For example, by supplying the $B_2H_6$ gas to any one of the wafers 200 on which a pattern is formed with the supply amount of the $B_2H_6$ gas with which a film thickness distribution has a protrusion shape in any one of the wafers 200 on which no pattern is formed, a film thickness distribution on any one of the wafers 200 on which a pattern is formed can be horizontal (flat).

(3) Effect of the Present Embodiment

According to the present embodiment, one or more of the following effects can be obtained.

(a) By adjusting the supply amount of the $B_2H_6$ gas, in-plane uniformity of a W film can be arbitrarily controlled. A deposition rate of a W film tends to depend on the supply amount of the $B_2H_6$ gas. By adjusting the supply amount of the $B_2H_6$ gas, the deposition rate on a wafer can be controlled, and in-plane uniformity of a film thickness can be controlled. Whereas the $B_2H_6$ gas can be adsorbed in multiple layers, the $WF_6$ gas is not adsorbed in multiple layers (saturatedly adsorbed). Therefore, by setting the supply amount of the $WF_6$ gas to an amount equal to or more than the supply amount when the $WF_6$ gas is saturatedly adsorbed on a wafer, and changing only the supply amount of the $B_2H_6$ gas according to desired in-plane uniformity, in-plane uniformity of a W film can be arbitrarily controlled.

(b) By adjusting the supply amount of the $B_2H_6$ gas to an outer peripheral portion and an inner peripheral portion of a wafer, an in-plane film thickness distribution of a W film can be controlled. By changing the supply amount of the $B_2H_6$ gas to an outer peripheral portion and an inner peripheral portion of a wafer according to a film formation property of the $B_2H_6$ gas, an arbitrary film thickness distribution such as a protrusion, a recess, or a horizontal shape can be obtained.

(4) Modified Example

The film formation processing in the present embodiment is not limited to the aspect described above, and can be modified as in Modified Example described below.

Modified Example 1

Figure 11:
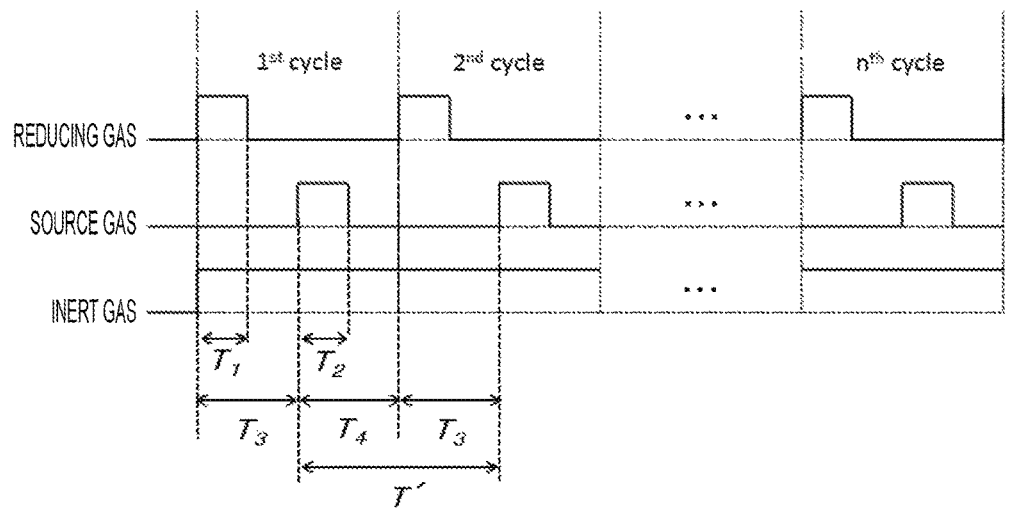
FIG. 11 is a diagram illustrating Modified Example of a film formation sequence of one embodiment of the present disclosure.

In the film formation sequence illustrated in FIG. 11, a rotational speed of the boat 217 in step 1 may be different from a rotational speed of the boat 217 in step 2. For example, in step 1, a rotation period $A_1$ of the boat 217 is synchronized with $B_2H_6$ gas supply start timing ($B_2H_6$ gas supply period), and in step 2, a rotation period $A_2$ of the boat 217 is not synchronized with $WF_6$ gas supply start timing ($WF_6$ gas supply period). Here, the rotation period A [min] of the boat 217 is derived from the following formula (3).

$$A=1/m \qquad \text{formula (3)}$$

m represents the rotation number of the boat 217.

The rotation number m of the boat 217 is derived from the following formula (4).

$$m=R\times T \qquad \text{formula (4)}$$

R [rpm] represents the rotational speed of the boat 217 (wafers 200), and T [min] represents gas supply time.

In step 1, in order to make supply of the $B_2H_6$ gas to the wafers 200 more uniform in a plane of each of the wafers 200, a rotational speed $R_1$ of the boat 217 and $B_2H_6$ gas supply time $T_1$ are set such that a rotation number $m_1$ of the boat 217 is an integral multiple ($m_1=R_1\times T_1$, $0<m_1$, $m_1$: integer). That is, in each cycle, supply start and supply stop of the $B_2H_6$ gas are performed from the same direction with respect to the wafers 200. In other words, the nozzle 249b is set so as to face the same position with respect to the wafers 200 each time when supply of the $B_2H_6$ gas is started and stopped in each cycle. For example, the rotational speed $R_1$ of the boat 217 is set to 0.4 to 4 [rpm].

In this manner, by making the rotation number $m_1$ of the boat 217 an integral multiple, the $B_2H_6$ gas can be continuously supplied at least while the wafers 200 are rotated once. That is, the $B_2H_6$ gas can be supplied from the entire peripheral direction of the wafers 200, a film thickness distribution in a plane of each of the wafers 200 can be concentric (uniform), and a desired film thickness distribution can be obtained.

In a case where the rotation number $m_1$ of the boat 217 is not an integral multiple, a certain portion in a plane of each of the wafers 200 is excessively exposed to the $B_2H_6$ gas, or another portion is insufficiently exposed to the $B_2H_6$ gas. That is, the exposure amount of the $B_2H_6$ gas in a plane of each of the wafers 200 is nonuniform. As a result, the film thickness distribution in a plane of each of the wafers 200 is not concentric, and a desired film thickness distribution cannot be obtained.

In step 2, a rotational speed $R_2$ of the boat 217 and $WF_6$ gas supply time $T_2$ are set such that a rotation period of the boat 217 is not synchronized with $WF_6$ gas supply start timing or $WF_6$ gas supply stop timing ($m_2\neq R_2\times T_2$, $0<m_2$, $m_2$: integer).

In a case where the rotational speed of the boat 217 in step 1 is not different from the rotational speed of the boat 217 in step 2, the $B_2H_6$ gas supply time $T_1$ is set such that the rotation number $m_1$ in step 1 is an integral multiple with respect to the rotational speed R ($m_1=R\times T_1$, $0<m_1$, $m_1$: integer). The $WF_6$ gas supply time $T_2$ is set such that the rotation number $m_2$ in step 2 is not an integral multiple ($m_2 \neq R\times T_2$, $0<m_2$, $m_2$: integer). Furthermore, a period T' [min] in one cycle is set such that a rotation number $m_3$ in one cycle is not an integral multiple ($m_3 \neq R\times T'$, $0<m_3$, $m_3$: integer).

According to such Modified Example, in addition to the effect in the film formation sequence illustrated in FIG. 4(a), the following effects are obtained.

By synchronizing a rotation period of the boat 217 with $B_2H_6$ gas supply start timing ($B_2H_6$ gas supply period), and not synchronizing the rotation period of the boat 217 with $WF_6$ gas supply start timing ($WF_6$ gas supply period) (shifting the rotation period of the boat 217 from supply start timing of the $WF_6$ gas), in-plane uniformity of a W film can be improved.

That is, the $B_2H_6$ gas itself may be adsorbed in multiple layers on each of the wafers 200. Therefore, even when $B_2H_6$ is saturatedly adsorbed on each of the wafers 200, when the $B_2H_6$ gas is further supplied to the wafers 200, $B_2H_6$ is adsorbed in multiple layers in a region exposed to the $B_2H_6$ gas. Therefore, the amount of adsorption of $B_2H_6$ in a certain region is larger than that in another region, and in-plane uniformity may be deteriorated.

A gas containing an element which becomes a solid by itself, such as the $B_2H_6$ gas, is hardly adsorbed saturatedly (easily adsorbed in multiple layers). Therefore, by supplying the $B_2H_6$ gas in the same amount (the same time) from the entire peripheral direction of the wafers 200, a film can be uniformly formed concentrically on each of the wafers 200. That is, the rotational speed $R_1$ of the boat 217 is controlled such that a $B_2H_6$ gas supply start position and a $B_2H_6$ gas supply stop position are the same. Note that the $B_2H_6$ gas supply start positions gas in cycles need not be the same. For example, the $B_2H_6$ gas supply start positions in cycles may be shifted from one another as long as the $B_2H_6$ gas supply start position and the $B_2H_6$ gas supply stop position are the same in each cycle.

Meanwhile, the $WF_6$ gas is hardly adsorbed in multiple layers on each of the wafers 200 (easily adsorbed saturatedly). Therefore, if the $WF_6$ gas is supplied from the same direction each time in each cycle, the supply amount of the $WF_6$ gas is insufficient at a position opposite to the $WF_6$ gas supply position, and in-plane uniformity may be deteriorated. Therefore, in a gas which is easily adsorbed saturatedly, by making the rotation period of the boat 217 asynchronous with the gas supply start timing, a film can be uniformly formed concentrically on each of the wafers 200.

Other Embodiments

Hitherto, the embodiment of the present disclosure has been specifically. However, the present disclosure is not limited to the above-described embodiment, and various modifications can be made within a range not departing from the gist thereof.

For example, in the above-described embodiment, an example in which the metal-containing raw material and the reducing agent are supplied into the process chamber 201 from one nozzle has been described. However, the present disclosure is not limited to such an aspect, and the reducing agent may be supplied into the process chamber 201 from a plurality of nozzles. In this case, a processing procedure and a processing condition can also be similar to those in the above-described embodiment, for example.

Figure 12:
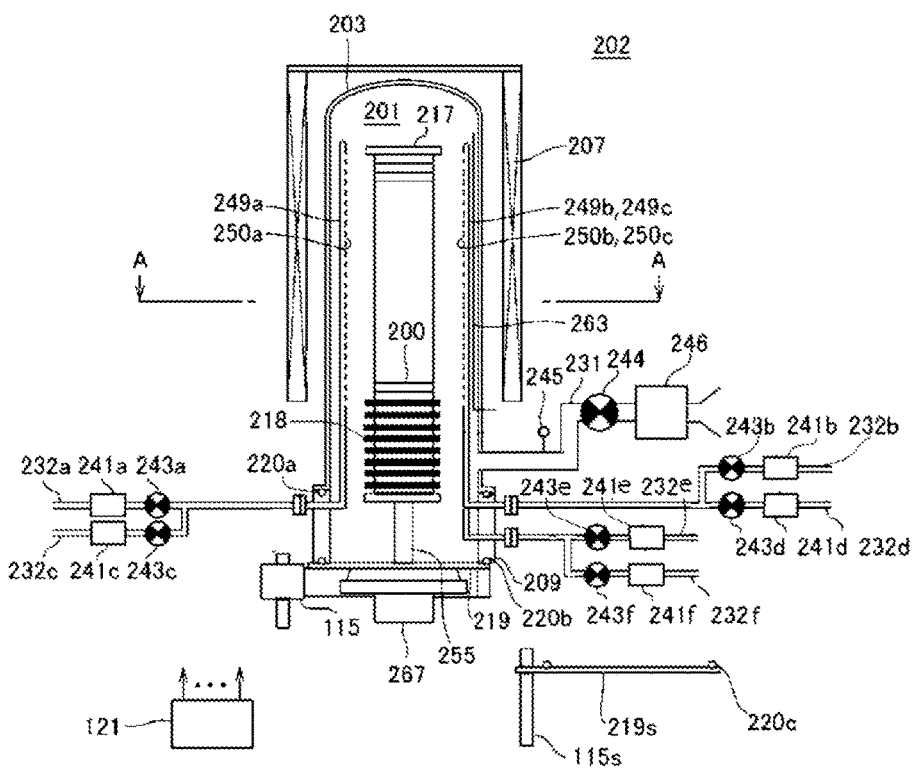
FIG. 12 is a schematic configuration diagram of a vertical process furnace of a substrate processing apparatus suitably used in another embodiment of the present disclosure, and illustrates a vertical cross-sectional view of a process furnace portion.

A difference from the above-described embodiment is that a nozzle 249c is disposed in the process chamber 201. Hereinafter, description of the same configuration as that of the above-described embodiment will be omitted. As illustrated in FIG. 12, the nozzle 249c is disposed in the process chamber 201 similarly to the nozzles 249a and 249b. A gas supply pipe 232e is connected to the nozzle 249c. In the gas supply pipe 232e, an MFC 241e and a valve 243e are disposed in order from an upstream side. A gas supply pipe 232f for supplying an inert gas is connected to the gas supply pipe 232e at a downstream side of the valve 243e. In the gas supply pipe 232f, an MFC 241f and a valve 243f are disposed in order from an upstream side.

Figure 13:
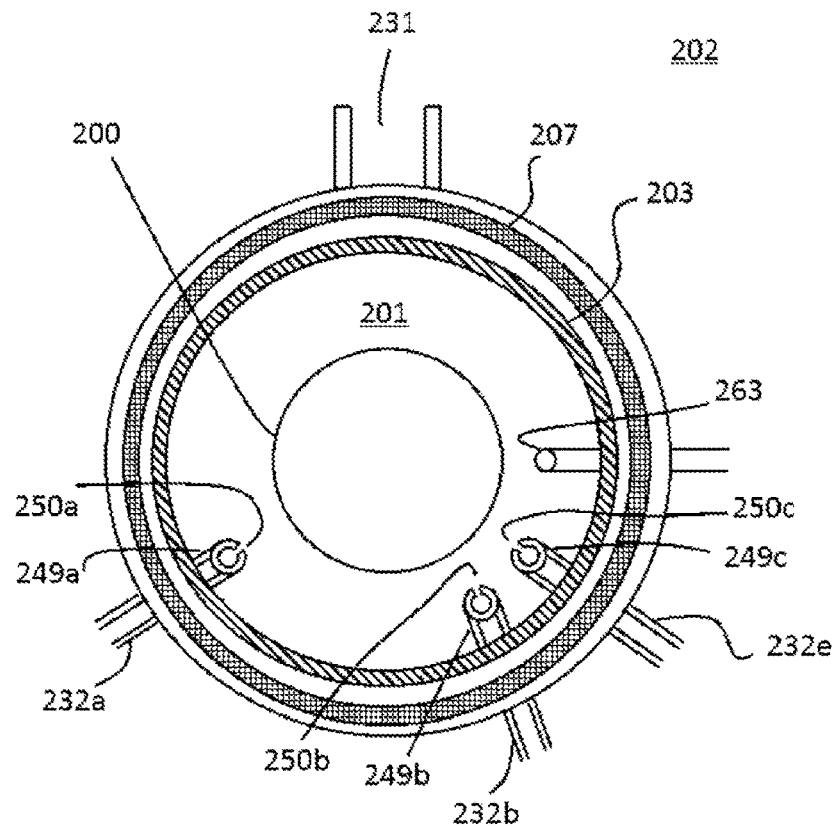
FIG. 13 is a schematic configuration diagram of a part of a vertical process furnace of a substrate processing apparatus suitably used in another embodiment of the present disclosure, and illustrates a cross-sectional view of a part of the process furnace cut alone line A-A in FIG. 12.
Figure 14:
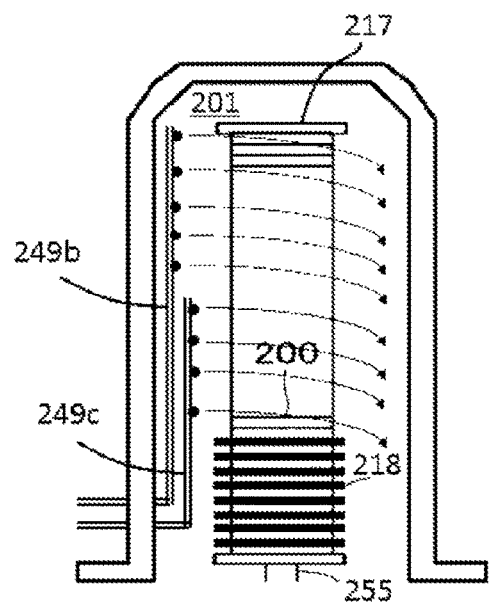
FIG. 14 is a vertical cross-sectional view of a part of a vertical process furnace of a substrate processing apparatus suitably used in another embodiment of the present disclosure.

The nozzle 249c is connected to a tip portion of the gas supply pipe 232e. As illustrated in FIG. 13, the nozzle 249c is disposed in an annular space in plan view between an inner wall of the reaction tube 203 and each of the wafers 200 along an upper portion from a lower portion of the inner wall of the reaction tube 203 so as to rise upward in a stacking direction of the wafers 200. That is, the nozzle 249c is disposed along a wafer arrangement region where the wafers 200 are arranged in a region horizontally surrounding the wafer arrangement region on a lateral side of the wafer arrangement region. That is, the nozzle 249c is disposed vertically to a surface (flat surface) of each of the wafers 200 on a lateral side of an end portion (peripheral portion) of each of the wafers 200 loaded into the process chamber 201. The nozzle 249c is configured as an L-shaped long nozzle, and a horizontal portion thereof is disposed so as to pass through a side wall of the manifold 209. A vertical portion thereof is disposed so as to rise at least from one end side of the wafer arrangement region toward the other end side thereof. A gas supply hole 250c for supplying a gas is disposed on a side surface of the nozzle 249c. The gas supply hole 250c is open so as to face a center of the reaction tube 203, and can supply a gas toward the wafers 200. A plurality of the gas supply holes 250c is disposed from a lower portion to an upper portion of the reaction tube 203, has the same opening area, and is further disposed with the same opening pitch. As illustrated in FIG. 14, a vertical portion of the nozzle 249c is formed so as to be shorter than a vertical portion of each of the nozzles 249a and 249b.

From the gas supply pipe 232e, for example, a boron (B)-containing gas as a reducing agent (reducing gas) is supplied into the process chamber 201 through the MFC 241e, the valve 243e, and the nozzle 249e. The same kind of reducing agent is supplied from the gas supply pipes 232b and 232e.

From the gas supply pipe 232f, for example, a nitrogen ($N_2$) gas as an inert gas is supplied into the process chamber 201 through the MFC 241f, the valve 243f, the gas supply pipe 232e, and the nozzle 249c.

In a case where the above-described reducing agent is supplied from the gas supply pipes 232b and 232e, mainly, the gas supply pipes 232b and 232e, the MFCs 241b and 241e, and the valves 243b and 243e constitute a reducing agent supply system. The nozzles 249b and 249e may be included in the reducing agent supply system.

In addition, mainly, the gas supply pipes 232c, 232d, and 232f, the MFCs 241c, 241d, and 241f, and the valves 243c, 243d, and 243f constitute an inert gas supply system.

Here, the exposure amount of the $B_2H_6$ gas to each of the wafers 200 in a stacking direction (height direction) of the wafers 200 will be described. Decomposition of the $B_2H_6$ gas has temperature dependency. The higher the temperature is, the more easily the $B_2H_6$ gas is decomposed. When the $B_2H_6$ gas is decomposed, adsorption of $B_2H_6$ onto each of the wafers 200 is less likely to occur. When the $B_2H_6$ gas flows through the nozzle 249b, time during which the $B_2H_6$ gas is heated by the heater 207 is longer for the $B_2H_6$ gas on a top side (upper side) in the nozzle 249b than for the $B_2H_6$ gas on a bottom side (lower side). Therefore, a thermal history of the $B_2H_6$ gas is different between the top side and the bottom side in the nozzle 249b. Therefore, the $B_2H_6$ gas on the top side in the nozzle 249b is more easily decomposed than the $B_2H_6$ gas on the bottom side. As a result, the supply amount of the undecomposed $B_2H_6$ gas varies in a height direction in the process chamber 201. That is, the exposure amount of the $B_2H_6$ gas to the wafers 200 varies in the height direction in the process chamber 201. In particular, the $B_2H_6$ gas on the top side in the nozzle 249b is supplied to the upper wafers 200 in the process chamber 201. Therefore, the film thickness on each of the upper wafers 200 is lower than that on each of the lower wafers 200 in the process chamber 201. Film thickness uniformity between planes may be deteriorated.

A decomposition rate of the $B_2H_6$ gas varies depending on a dilution gas (inert gas). Examples of the dilution gas for the $B_2H_6$ gas include an $N_2$ gas, an $H_2$ gas, an Ar gas, and a He gas. In a case where an $N_2$ gas is used as the dilution gas for the $B_2H_6$ gas (in a case where an $N_2$-diluted $B_2H_6$ gas is used), the decomposition rate of the $B_2H_6$ gas tends to be high. Meanwhile, in a case where an $H_2$ gas is used as the dilution gas for the $B_2H_6$ gas (in a case where an $H_2$-diluted $B_2H_6$ gas is used), the decomposition rate of $B_2H_6$ gas tends to be lower than a case where an $N_2$ gas is used.

As a result of intensive studies, the inventors have found that uniformity between planes can be improved by supplying a $B_2H_6$ gas which is easily decomposed and a $B_2H_6$ gas Which is hardly decomposed into the process chamber 201. For example, an $H_2$-diluted $B_2H_6$ gas is supplied as the $B_2H_6$ gas which is hardly decomposed into an upper portion of the process chamber 201, and an $N_2$-diluted $B_2H_6$ gas is supplied as the $B_2H_6$ gas which is easily decomposed into a lower portion located at a lower position than the upper portion of the process chamber 201. In this manner, by supplying the $B_2H_6$ gases having different decomposition rates ($B_2H_6$ gases containing different dilution gases) between an upper portion and a lower position in the process chamber 201, the supply amount of the $B_2H_6$ gas in the height direction in the process chamber 201 can be almost constant. This makes it possible to improve the film thickness uniformity between planes of the wafers 200.

When a $B_2H_6$ gas which is easily decomposed and a $B_2H_6$ gas which is hardly decomposed are simultaneously supplied into the process chamber 201, these gases are desirably supplied from different nozzles. For example, preferably, a $B_2H_6$ gas ($N_2$-diluted $B_2H_6$ gas) which is easily decomposed is supplied from the short nozzle 249c downward in the process chamber 201 via the gas supply pipe 232e, and a $B_2H_6$ gas ($H_2$-diluted $B_2H_6$ gas) which is hardly decomposed is supplied from the long nozzle 249b upward in the process chamber 201 via the gas supply pipe 232b.

Incidentally, in the above description, an example in which the diluted $B_2H_6$ gas is supplied to the gas supply pipes 232b and 232e has been described, but the $B_2H_6$ gas may be diluted in the gas supply pipe 232a. For example, by supplying a $B_2H_6$ gas not diluted to the gas supply pipes 232b and 232e and supplying an $N_2$ gas and an $H_2$ gas to the gas supply pipes 232d and 232f, respectively, the $B_2H_6$ gas may be diluted with each dilution gas in the gas supply pipes 232b and 232e. In the above description, an example in which the two $B_2H_6$ gas supply nozzles are disposed has been described, but three or more $B_2H_6$ gas supply nozzles may be disposed.

Furthermore, for example, in the above-described embodiment, an example in which the source gas is supplied after the reducing gas is supplied in step 1 has been described. However, the present disclosure is not limited to such an aspect, and the supply order of the reducing gas and the source gas may be reversed. That is, the reducing gas may be supplied after the source gas is supplied. By changing the supply order, it is possible to change film quality and a composition ratio of a film to be formed.

In addition, for example, in the above-described embodiment, a case of forming a W film has been described. However, the present disclosure can also be suitably applied to a case of forming a metal nitride film such as a WN film. For example, the present disclosure can also be suitably applied to a case of forming a tungsten nitride film (WN film) or the like on each of the wafers 200.

For example, a WN film or the like can be formed by the following film formation sequence.

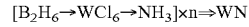

That is, after step 2 described above, step 3 for supplying a nitriding agent to the wafers 200 is added. In this case, one nozzle for supplying the nitriding agent is preferably disposed to use three nozzles. For example, step 3 has the following processing conditions.

[Step 3]

Pressure in process chamber 201: 30 Pa to 1500 Pa, preferably 40 Pa to 900 Pa

Supply flow rate of $NH_3$ gas: 1.0 slm to 15 slm, preferably 5 slm to 13.5 slm

Supply flow rate of $N_2$ gas: 0.2 slm to 12 slm, preferably 1 slm to 5 slm

Supply time of $NH_3$ gas: 10 seconds to 50 seconds, preferably 20 seconds to 40 seconds By performing a predetermined number of times (n times) of cycles of non-simultaneously, that is, non-synchronously, Performing steps 1 to 3, a WN film having a predetermined composition and a predetermined film thickness can be formed on each of the wafers 200. In this case, the processing procedures and processing conditions of steps 1 and 2 can be similar to those of the above-described embodiment and Modified Example. Even in these cases, effects similar to those of the above-described embodiment and Modified Example can be obtained. That is, the present disclosure can be suitably applied to the case of forming a nitride film containing a metal element.

As the nitriding gas, in addition to the $NH_3$ gas, for example, a hydrogen nitride-based gas such as a diazene ($N_2H_2$) gas, a hydrazine ($N_2H_4$) gas, or a $N_3H_8$ gas can be used. In addition, as a reactant, a gas containing an amine, that is, an amine-based gas can be used. As the amine-based gas, a monomethylamine ($CH_3NH_2$, abbreviation: MMA) gas, a dimethylamine (($CH_3$)$_2$NH, abbreviation: DMA) gas, a trimethylamine (($CH_3$)$_3$N, abbreviation: TMA) gas, a monoethylamine ($C_2H_5NH_2$, abbreviation: MEA) gas, a diethylamine (($C_2H_5$)$_2$NH, abbreviation: DEA) gas, a triethylamine (($C_2H_5$)$_3$N, abbreviation: TEA) gas, or the like can be used. In addition, as the reactant, a gas containing an organic hydrazine compound, that is, an organic hydrazine-based gas can be used. Examples of the organic hydrazine-based gas include a monomethyl hydrazine (($CH_3$)$HN_2H_2$, abbreviation: MMH) gas, a dimethyl hydrazine (($CH_3$)$_2N_2H_2$, abbreviation: DMH) gas, and a trimethyl hydrazine (($CH)_2N_2(CH_3$)H, abbreviation: TMH) gas.

Preferably, a recipe (a program describing a processing procedure, a processing condition, or the like) used for substrate processing is individually prepared according to processing contents (film type, composition ratio, film quality, film thickness, processing procedure, processing condition, and the like of a film to be formed), and stored in the memory device 121c through an electric communication line or the external memory device 123. When substrate processing is started, the CPU 121a preferably selects an appropriate recipe appropriately from among a plurality of recipes stored in the memory device 121c according to processing contents. This makes it possible to form films of various film types, composition ratios, film qualities, and film thicknesses with high reproducibility with one substrate processing apparatus. In addition, it is possible to reduce an operator's burden (burden of inputting a processing procedure, a processing condition, and the like), and to quickly start substrate processing while avoiding an operation error.

The above-described recipe is not necessarily newly created, but may be prepared by, for example, changing an existing recipe already installed in a substrate processing apparatus. In a case of changing a recipe, a changed recipe may be installed in a substrate processing apparatus through an electric communication line or a recording medium in which the recipe is recorded. In addition, by operating the input/output device 122 included in an existing substrate processing apparatus, an existing recipe already installed in the substrate processing apparatus may be directly changed.

In the above-described embodiment, an example in which a film is formed using a batch type substrate processing apparatus that processes a plurality of substrates at one time has been described. The present disclosure is not limited to the above-described embodiment, but can be suitably applied to a case where a film is formed using a single-wafer type substrate processing apparatus that processes one or several substrates at one time, for example. In addition, in the above-described embodiment, an example in which a film is formed using a substrate processing apparatus having a hot wall type process furnace has been described. The present disclosure is not limited to the above-described embodiment, but can also be suitably applied to a case where a film is formed using a substrate processing apparatus having a cold wall type process furnace. In these cases, a processing procedure and a processing condition can also be similar to those in the above-described embodiment, for example.

Figure 15:
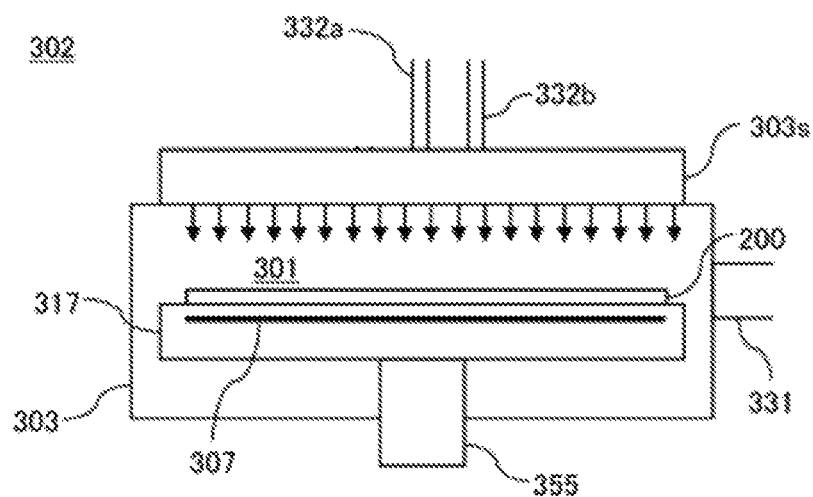
FIG. 15 is a schematic configuration diagram of a process furnace of a substrate processing apparatus suitably used in another embodiment of the present disclosure, and illustrates a vertical cross-sectional view of the process furnace portion.

For example, the present disclosure can also be suitably applied to a case where a film is formed using a substrate processing apparatus including a process furnace 302 illustrated in FIG. 15. The process furnace 302 includes a processing container 303 forming a process chamber 301, a shower head 303s serving as a gas supplier for supplying a gas in a shower shape into the process chamber 301, a support base 317 for supporting one or several wafers 200 in a horizontal posture, a rotation shaft 355 for supporting the support base 317 from below, and a heater 307 disposed on the support base 317. Gas supply ports 332a and 332b are connected to an inlet (gas inlet) of the shower head 303s. A supply system similar to the raw material supply system of the above-described embodiment is connected to the gas supply port 332a. A gas supplied from the raw material supply system is supplied into the process chamber 301 through the shower head 303s. A supply system similar to the reducing agent supply system of the above-described embodiment is connected to the gas supply port 332b. A gas dispersion plate for supplying a gas in a shower shape into the process chamber 301 is disposed in an outlet (gas discharge port) of the shower head 303s. The shower head 303s is disposed at a position opposed to (facing) a surface of any one of the wafers 200 loaded into the process chamber 301. An exhaust port 331 for exhausting an interior of the process chamber 301 is disposed in the processing container 303. An exhaust system similar to the exhaust system of the above-described embodiment is connected to the exhaust port 331.

Figure 16:
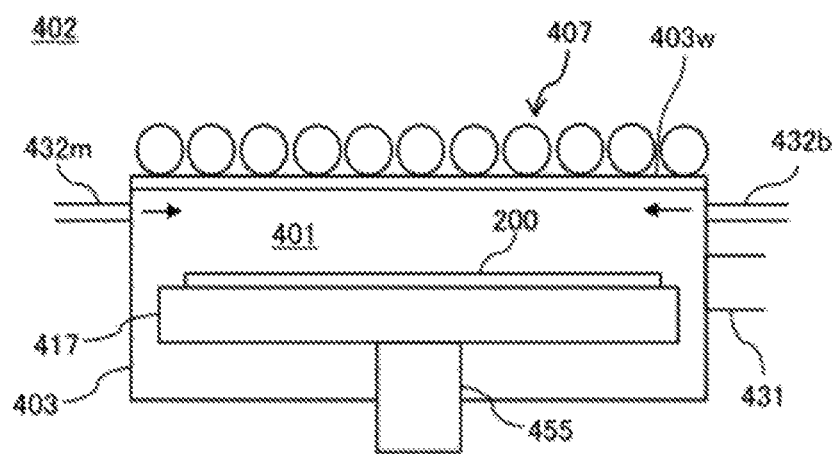
FIG. 16 is a schematic configuration diagram of a process furnace of a substrate processing apparatus suitably used in another embodiment of the present disclosure, and illustrates a vertical cross-sectional view of the process furnace portion.

In addition, for example, the present disclosure can also be suitably applied to a case where a film is formed using a substrate processing apparatus including a process furnace 402 illustrated in FIG. 16. The process furnace 402 includes a processing container 403 forming a process chamber 401, a support base 417 for supporting one or several wafers 200 in a horizontal posture, a rotation shaft 455 for supporting the support base 417 from below, a lamp heater 407 for emitting light toward the wafers 200 in the processing container 403, and a quartz window 403w for transmitting light of the lamp heater 407. A gas supply port 432m is connected to the processing container 403. A supply system similar to the raw material supply system of the above-described embodiment is connected to the gas supply port 432m. A gas supplied from the raw material supply system is supplied into the process chamber 401. In addition, a gas supply port 432b is connected to the processing container 403. A supply system similar to the reducing agent supply system of the above-described embodiment is connected to the gas supply port 432b. The gas supply ports 432m and 432b are disposed on a lateral side of an end portion of any one of the wafers 200 loaded into the process chamber 401, that is, at positions not opposed to a surface of any one of the wafers 200 loaded into the process chamber 401. An exhaust port 431 for exhausting an interior of the process chamber 401 is disposed in the processing container 403. An exhaust system similar to the exhaust system of the above-described embodiment is connected to the exhaust port 431.

Also in a case where these substrate processing apparatuses are used, film formation processing can be performed under a processing procedure and a processing condition similar to those in the above-described embodiment and Modified Example, and effects similar to those in the above-described embodiment and Modified Example can be obtained.

The above-described embodiment, Modified Example, and the like can be combined to each other appropriately to be used. In this case, a processing procedure and a processing condition in this case can be similar to those of the above-described embodiment.

Aspects of the Present Disclosure

Hereinafter, preferable aspects of the present disclosure will be additionally stated.

(Supplementary Note 1)

According to an embodiment of the present disclosure, there is provided a method of manufacturing a semiconductor device, the method including: forming a film on a substrate by performing a predetermined number of cycles in which supplying a metal-containing gas to the substrate and supplying a reducing gas containing an element that becomes a solid by itself to the substrate are performed in a time-division manner, wherein the reducing gas has a property of changing a deposition rate of the film from an increasing rate to a decreasing rate in accordance with the exposure amount of the reducing gas with respect to the substrate, and in supplying the reducing gas, the exposure amount of the reducing gas with respect to the substrate is adjusted in accordance with the property of the reducing gas.
(Supplementary Note 2)

Preferably, in the method of manufacturing a semiconductor device according to Supplementary Note 1, the property of the reducing gas is that in a case where an exposure amount d of the reducing gas with respect to the substrate is less than a first exposure amount d1 (d<d1), as the exposure amount of the reducing gas with respect to the substrate increases, the deposition rate of the film increases in a case where the exposure amount d of the reducing gas with respect to the substrate is the first exposure amount d1 or more and less than a second exposure amount d2 (d1≤d<d2), the deposition rate of the film is maintained almost constant regardless of the exposure amount of the reducing gas with respect to the substrate, in a case where the exposure amount d of the reducing gas with respect to the substrate is the second exposure amount d2 or more and less than a third exposure amount d3 (d2≤d<d3), as the exposure amount of the reducing gas with respect to the substrate increases, the deposition rate of the film decreases, and in a case where the exposure amount d of the reducing gas with respect to the substrate is the third exposure amount d3 or more (d3≤d), the film is hardly formed regardless of the exposure amount of the reducing gas with respect to the substrate.
(Supplementary Note 3)

Preferably, in the method of manufacturing a semiconductor device according to Supplementary Note 2, especially when the reducing gas is supplied horizontally (parallel) with respect to a surface of the substrate, by supplying the reducing gas to a central portion of the substrate so as to satisfy a relationship of dy<d1 provided that dy represents the exposure amount of the reducing gas with respect to the central portion of the substrate, and by supplying the reducing gas to an outer peripheral portion of the substrate so as to satisfy a relationship of d1≤dx provided that dx represents the exposure amount of the reducing gas with respect to the outer peripheral portion of the substrate, the film having a recess shape is formed on the substrate.
(Supplementary Note 4)

Preferably, in the method of manufacturing a semiconductor device according to Supplementary Note 2, especially when the reducing gas is supplied horizontally (parallel) with respect to a surface of the substrate, by supplying the reducing gas to a central portion of the substrate so as to satisfy a relationship of $d_2<d_y$ provided that $d_y$ represents the exposure amount of the reducing gas with respect to the central portion of the substrate, and by supplying the reducing gas to an outer peripheral portion of the substrate so as to satisfy a relationship of $d_2 \leq d_x$ provided that $d_x$ represents the exposure amount of the reducing gas with respect to the outer peripheral portion of the substrate, the film having a protrusion shape is formed on the substrate.
(Supplementary Note 5)

Preferably, in the method of manufacturing a semiconductor device according to Supplementary Note 2, especially when the reducing gas is supplied vertically with respect to a surface of the substrate from above, by supplying the reducing gas to a central portion of the substrate so as to satisfy a relationship of dy≥d1 provided that dy represents the exposure amount of the reducing gas with respect to the central portion of the substrate, and by supplying the reducing gas to an outer peripheral portion of the substrate so as to satisfy a relationship of d1>dx provided that dx represents the exposure amount of the reducing gas with respect to the outer peripheral portion of the substrate, the film having a protrusion shape is formed on the substrate.
(Supplementary Note 6)

Preferably, in the method of manufacturing a semiconductor device according to Supplementary Note 2, especially when the reducing gas is supplied vertically with respect to a surface of the substrate from above, by supplying the reducing gas to a central portion of the substrate so as to satisfy a relationship of $d_y \geq d_2$ provided that $d_y$ represents the exposure amount of the reducing gas with respect to the central portion of the substrate, and by supplying the reducing gas to an outer peripheral portion of the substrate so as to satisfy a relationship of $d_2 > d_x$ provided that $d_x$ represents the exposure amount of the reducing gas with respect to the outer peripheral portion of the substrate, the film having a recess shape is formed on the substrate.

INDUSTRIAL APPLICABILITY

According to the present disclosure, it is possible to provide a method of manufacturing a semiconductor device, a substrate processing apparatus, and a recording medium, capable of controlling in-plane uniformity of a film formed on a substrate.

REFERENCE SIGNS LIST

121 Controller (control portion)
200 Wafer (substrate)
201 Process chamber
202 Process furnace
203 Reaction tube
207 Heater
231 Exhaust pipe
232*a* to 232*d* Gas supply pipe

The invention claimed is:
1. A method of manufacturing a semiconductor device, the method comprising:
  forming a film on a substrate by performing a cycle a predetermined number of times, wherein the cycle includes:
    supplying a metal-containing gas to the substrate,
    supplying a reducing gas containing an element that becomes a solid by itself to the substrate, wherein the reducing gas has a property of changing a deposition rate of the film from an increasing rate to a decreasing rate in accordance with an increasing of an exposure amount of the reducing gas with respect to the substrate, and
    adjusting, the exposure amount of the reducing gas with respect to the substrate for a subsequent cycle in accordance with the property of the reducing gas
  wherein the supplying the metal-containing gas and supplying the reducing gas in the cycle are performed non-simultaneously.
2. The method according to claim 1, wherein
the property of the reducing gas is that
in a case where an exposure amount d of the reducing gas with respect to the substrate is less than a first exposure amount d1 (d<d1), as the exposure amount of the reducing gas with respect to the substrate increases, the deposition rate of the film increases,
in a case where the exposure amount d of the reducing gas with respect to the substrate is the first exposure amount d1 or more and less than a second exposure amount d2 (d1≤d<d2), the deposition rate of the film is maintained almost constant regardless of the exposure amount of the reducing gas with respect to the substrate, in a case where the exposure amount d of the reducing gas with respect to the substrate is the second exposure amount d2 or more and less than a third exposure amount d3 (d2≤d<d3), as the exposure amount of the reducing gas with respect to the substrate increases, the deposition rate of the film decreases, and in a case where the exposure amount d of the reducing gas with respect to the substrate is the third exposure amount d3 or more (d3≤d), the film is hardly formed regardless of the exposure amount of the reducing gas with respect to the substrate.

3. The method according to claim 2, wherein the first exposure amount d1 is the exposure amount of the reducing gas with respect to the substrate when molecules of the reducing gas are adsorbed on the entire surface of the substrate, the second exposure amount d2 is the exposure amount of the reducing gas with respect to the substrate when molecules of the reducing gas are adsorbed in multiple layers at least on a partial region on the substrate, and the third exposure amount d3 is the exposure amount of the reducing gas with respect to the substrate when molecules of the reducing gas are adsorbed in multiple layers on the entire surface of the substrate.

4. The method according to claim 2, wherein by supplying the reducing gas to a central portion of the substrate so as to satisfy a relationship of dy≥d1 provided that dy represents the exposure amount of the reducing gas with respect to the central portion of the substrate, and by supplying the reducing gas to an outer peripheral portion of the substrate so as to satisfy a relationship of d1>dx provided that dx represents the exposure amount of the reducing gas with respect to the outer peripheral portion of the substrate, the film having a protrusion shape is formed on the substrate.

5. The method according to claim 4, wherein the reducing gas is supplied vertically with respect to a surface of the substrate from above.

6. The method according to claim 2, wherein by supplying the reducing gas to a central portion of the substrate so as to satisfy a relationship of d2>dy provided that dy represents the exposure amount of the reducing gas with respect to the central portion of the substrate, and by supplying the reducing gas to an outer peripheral portion of the substrate so as to satisfy a relationship of d2≤dx provided that dx represents the exposure amount of the reducing gas with respect to the outer peripheral portion of the substrate, the film having a protrusion shape is formed on the substrate.

7. The method according to claim 6, wherein the reducing gas is supplied horizontally with respect to a surface of the substrate.

8. The method according to claim 2, wherein by supplying the reducing gas to a central portion of the substrate so as to satisfy a relationship of dy≥d2 provided that dy represents the exposure amount of the reducing gas with respect to the central portion of the substrate, and by supplying the reducing gas to an outer peripheral portion of the substrate so as to satisfy a relationship of d2>dx provided that dx represents the exposure amount of the reducing gas with respect to the outer peripheral portion of the substrate, the film having a recess shape is formed on the substrate.

9. The method according to claim 8, wherein the reducing gas is supplied vertically with respect to a surface of the substrate from above.

10. The method according to claim 2, wherein by supplying the reducing gas to a central portion of the substrate so as to satisfy a relationship of dy<d1 provided that dy represents the exposure amount of the reducing gas with respect to the central portion of the substrate, and by supplying the reducing gas to an outer peripheral portion of the substrate so as to satisfy a relationship of d1≤dx provided that dx represents the exposure amount of the reducing gas with respect to the outer peripheral portion of the substrate, the film having a recess shape is formed on the substrate.

11. The method according to claim 10, wherein the reducing gas is supplied horizontally with respect to a surface of the substrate.

12. The method according to claim 2, wherein by supplying the reducing gas to the entire surface of the substrate in the exposure amount of the first exposure amount d1 or more and less than the second exposure amount d2, the film having an almost flat shape is formed on the substrate.

13. The method according to claim 1, wherein the exposure amount is adjusted by controlling at least one of supply amount, supply time, and pressure of the reducing gas.

14. The method according to claim 1, wherein the film is formed while a temperature of the substrate is maintained at 60° C. or higher and 230° C. or lower.

15. The method according to claim 1, wherein the reducing gas is a boron containing gas.

16. The method according to claim 1, wherein the reducing gas is diborane ($B_2H_6$).

17. The method according to claim 1, wherein the element that becomes the solid by itself is boron (B) or silicon (Si).

18. The method according to claim 1, wherein the reducing gas is silane ($SiH_4$) gas.

19. The method according to claim 1, wherein the reducing gas is a disilane ($Si_2H_6$).

* * * * *